(12) United States Patent
Flood

(10) Patent No.: US 8,431,818 B2
(45) Date of Patent: Apr. 30, 2013

(54) SOLAR CELLS AND PHOTODETECTORS WITH SEMICONDUCTING NANOSTRUCTURES

(75) Inventor: Dennis J. Flood, Oberlin, OH (US)

(73) Assignee: Vanguard Solar, Inc., Sudbury, MA (US)

( * ) Notice: Subject to any disclaimer, the term of this patent is extended or adjusted under 35 U.S.C. 154(b) by 742 days.

(21) Appl. No.: 12/548,741

(22) Filed: Aug. 27, 2009

(65) Prior Publication Data

US 2010/0206362 A1  Aug. 19, 2010

Related U.S. Application Data

(63) Continuation-in-part of application No. 12/108,500, filed on Apr. 23, 2008, now Pat. No. 7,999,176.

(60) Provisional application No. 60/916,727, filed on May 8, 2007, provisional application No. 60/944,004, filed on Jun. 14, 2007, provisional application No. 60/947,139, filed on Jun. 29, 2007, provisional application No. 61/095,422, filed on Sep. 9, 2008.

(51) Int. Cl.
*H01L 31/04* (2006.01)

(52) U.S. Cl.
USPC ..... 136/263; 136/252; 977/948; 257/E31.001

(58) Field of Classification Search .................. None
See application file for complete search history.

(56) References Cited

U.S. PATENT DOCUMENTS

| | | |
|---|---|---|
| 3,150,999 A | 9/1964 | Rudenberg et al. |
| 5,424,054 A | 6/1995 | Bethune et al. |

(Continued)

FOREIGN PATENT DOCUMENTS

| | | |
|---|---|---|
| KR | 100649743 | 11/2006 |
| WO | 03043934 | 5/2003 |

(Continued)

OTHER PUBLICATIONS

Landi et al. "CdSe quantum dot-single wall carbon nanotube complexes for polymeric solar cells" Solar Energy Materials & Solar Cells 87 (2005) 733-746.*

(Continued)

*Primary Examiner* — Jennifer Michener
*Assistant Examiner* — Magali P Slawski
(74) *Attorney, Agent, or Firm* — Winstead PC

(57) ABSTRACT

Improved photovoltaic devices and methods are disclosed. In one embodiment, an exemplary photovoltaic device includes a semiconductor layer and a light-responsive layer (which can be made, for example, of a semiconductor material) which form a junction, such as a p-n junction. The light-responsive layer can include a plurality of carbon nanostructures, such as carbon nanotubes, located therein. In many cases, the carbon nanostructures can provide a conductive pathway within the light-responsive layer. In another embodiment, an exemplary photovoltaic device can include a light-responsive layer made of a semiconductor material in which is embedded a plurality of semiconducting carbon nanostructures (such as p-type single-wall carbon nanotubes). The interfaces between the semiconductor material and the semiconducting carbon nanostructures can form p-n junctions. In yet other embodiments, exemplary photovoltaic devices include semiconductor nanostructures, which can take a variety of forms, in addition to the carbon nanostructures. Further embodiments include a wide variety of other configurations and features. Methods of fabricating photovoltaic devices, as well as nanostructured photodetectors, as also disclosed.

24 Claims, 17 Drawing Sheets

U.S. PATENT DOCUMENTS

| | | | |
|---|---|---|---|
| 5,454,880 | A | 10/1995 | Sariciftci et al. |
| 5,456,762 | A | 10/1995 | Kariya et al. |
| 5,747,161 | A | 5/1998 | Iijima et al. |
| 5,908,585 | A | 6/1999 | Shibuta et al. |
| 6,207,229 | B1 | 3/2001 | Bawendi et al. |
| 6,559,375 | B1 | 5/2003 | Meissner et al. |
| 6,683,783 | B1 | 1/2004 | Liu et al. |
| 6,723,624 | B2 | 4/2004 | Wang et al. |
| 6,918,946 | B2 | 7/2005 | Korgel et al. |
| 6,946,597 | B2 | 9/2005 | Sager et al. |
| 6,969,897 | B2 | 11/2005 | Kim, II |
| 7,057,256 | B2 | 6/2006 | Carey et al. |
| 7,125,534 | B1 | 10/2006 | Smalley et al. |
| 7,150,864 | B1 | 12/2006 | Smalley et al. |
| 7,253,014 | B2 | 8/2007 | Barron et al. |
| 7,253,431 | B2 | 8/2007 | Afzali-Ardakaniet al. |
| 7,354,563 | B2 | 4/2008 | Smalley et al. |
| 7,999,176 | B2 | 8/2011 | Flood |
| 2002/0076846 | A1 | 6/2002 | Ihm |
| 2002/0084504 | A1 | 7/2002 | Narayan |
| 2005/0089684 | A1 | 4/2005 | Barron et al. |
| 2005/0249656 | A1 | 11/2005 | Smalley et al. |
| 2005/0257824 | A1 | 11/2005 | Maltby et al. |
| 2005/0260120 | A1 | 11/2005 | Smalley et al. |
| 2006/0067870 | A1 | 3/2006 | Park et al. |
| 2006/0145194 | A1 | 7/2006 | Barron et al. |
| 2006/0186502 | A1 | 8/2006 | Shimotani et al. |
| 2006/0249203 | A1 | 11/2006 | Li et al. |
| 2007/0012354 | A1 | 1/2007 | Kobayashi et al. |
| 2008/0023067 | A1 | 1/2008 | Hu et al. |
| 2008/0066802 | A1* | 3/2008 | Reddy ............................ 136/258 |
| 2008/0171204 | A1 | 7/2008 | Barron et al. |
| 2008/0279756 | A1 | 11/2008 | Zhamu et al. |
| 2009/0200707 | A1 | 8/2009 | Kivioja et al. |
| 2010/0206362 | A1 | 8/2010 | Flood |

FOREIGN PATENT DOCUMENTS

| | | |
|---|---|---|
| WO | 2004042432 | 5/2004 |
| WO | 2004044948 | 5/2004 |
| WO | 2004046023 | 6/2004 |
| WO | 2005000735 | 6/2005 |
| WO | 2007040594 | 4/2007 |
| WO | 2008137995 | 11/2008 |
| WO | 2010030511 | 3/2010 |

OTHER PUBLICATIONS

Loscutova, Ryan and Barron, Andrew R., "Coating single-walled carbon nanotubes with cadmium chalcogenides", The Royal Society of Chemistry 2005, J.Mater.Chem., 2005, 15, 4346-4353.

International Search Report and Written Opinion for PCT Appl. No. PCT/US2008/063076, mailed Sep. 16, 2008, 13 pgs.

Huang, et al., "Growth Mechanism of Oriented Long Single Walled Carbon Nanotubes Using 'Fast-Heating' Chemical Vapor Deposition Process," Nano Letters, vol. 4, No. 6, 1025-1028 (2004).

Fischer et al., "Magnetically Aligned single wall carbon nanotubes films: Preferred orientation and anisotropic transport properties," Journal of Applied Physics, vol. 93, No. 4, 2157 (2003).

Huang, et al., "Growth of highly oriented carbon nanotubes by plasma-enhanced hot filament chemical vapor deposition," Applied Physics Letters, vol. 73, No. 26, 3845 (1998).

Ren, et al., "Synthesis of Large Arrays of Well-Aligned Carbon Nanotubes on Glass," Science 282, 1105 (1998).

Pontes, et al., "Barrier-free substitutional doping of graphene sheets with boron atoms: Ab initio calculations," Phys. Rev. B 79, 033412 (2009).

Wei, et al., "Synthesis of N-Doped Graphene by Chemical Vapor Deposition and Its Electrical Properties," Nano Lett., 9 (5), pp. 1752-1758 (2009).

O'Connell, Michael J., Carbon Nanotubes: Properties and Applications 103-104 (CRC Press 2006).

International Preliminary Report on Patentability for PCT Appl. No. PCT/US2009/055143, Mar. 15, 2011, 12 pgs.

Landi, et al. "CdSe quantum dot-single wall carbon nanotube complexes for polymeric solar cells." Solar Energy Materials & Solar Cells 87 (2005) 733-746.

Solis et al. "Absorption and refractive index changes of poly(3-octylthiophene) under NO2 gas exposure." Optical Materials 29 (2006) 167-172.

Arcos et al. "Optical characterization of alignment and effective refractive index in carbon nanotube films." Nanotechnology 18 (2007) 265706 (5 pp).

* cited by examiner

SOLAR CELLS AND PHOTODETECTORS WITH SEMICONDUCTING NANOSTRUCTURES

REFERENCE TO RELATED APPLICATIONS

This application claims the benefit of priority of and is a non-provisional of U.S. Application Ser. No. 61/095,422, titled "Nanostructured Solar Cells and Photodetectors" and filed Sep. 9, 2008. This application is a continuation-in-part of U.S. patent Ser. No. 12/108,500, titled "Nanostructured Solar Cells" and filed Apr. 23, 2008 (now published as U.S. Patent Publication No. 2008/0276987), which claims the benefit of and is a non-provisional of U.S. Application No. 60/916,727, titled "Nanostructured Solar Cells" and filed May 8, 2007, U.S. Application No. 60/944,004, titled "Nanostructured Solar Cells" and filed Jun. 14, 2007, and U.S. Application No. 60/947,139, titled "Nanostructured Solar Cells" and filed Jun. 29, 2007. The teachings of all of the foregoing applications are hereby incorporated by reference in their entirety.

FIELD

The present application is generally directed to photovoltaic devices, including photodetectors, that incorporate carbon nano structures.

BACKGROUND

Solar energy represents an attractive source of clean, renewable energy. For many years, photovoltaic cells have been used in attempts to efficiently tap into this energy source. Photovoltaic cells convert light—be it light from the sun or otherwise—into electrical energy. For example, one kind of a photovoltaic cell contains layers of a semiconductor material such as silicon, which are doped to form a p-n junction. Light absorbed by the silicon creates charge carriers which can travel across the p-n junction, producing a current. The power generated by the cell can be tapped and utilized like other electrical power sources.

However, current photovoltaic devices have many drawbacks. Despite constant efforts at improvement, their efficiency at converting light to electrical energy remains low, and their fabrication cost is high. Further, they are often produced in bulky, rigid arrays, limiting their versatility.

There is a need for improved photovoltaics that offer improved performance and that can be easily installed and used in variety of applications both terrestrial and extra-terrestrial.

SUMMARY

Photovoltaic Devices and Methods

Photovoltaic devices and methods are disclosed. In one exemplary embodiment, a photovoltaic device can include a first semiconductor layer and a second light-responsive layer which forms a junction with the first layer. The junction can include a depletion region (such as a p-n junction). The second layer can include a mesh of carbon nanostructures (e.g., carbon nanotubes, such as single-wall or multi-wall tubes) at least partially embedded therein to provide a conductive path out of the second layer to an electrical contact.

In another embodiment, an exemplary photovoltaic device can include a first semiconductor layer and a second light-responsive layer. The first and second layers can form a junction, e.g., a junction with a depletion region. The second layer can include a mesh of carbon nanostructures at least partially embedded therein to provide an ohmic contact out of the second layer to an electrical contact.

In yet another embodiment, an exemplary photovoltaic device can include a first semiconductor layer and a second light-responsive layer. The first and second layers can form a junction, which can include a depletion region. The second layer can include a mesh of carbon nanostructures partially coated by the second layer and partially extending beyond the second layer as a mesh of uncoated carbon nanostructures, as well as an electrical contact layer in ohmic contact with the mesh of uncoated carbon nanostructures. The distance across which the uncoated carbon nanostructures extend can be in a range of about 100 to 10,000 nm.

Any of the foregoing embodiments can have a wide variety of other features. For example, the first and second layers can be made of semiconductor materials and can both be light-responsive. Possible semiconductor materials include Group II-VI semiconductor materials, such as CdS, CdO, CdSe, ZnS, CdTe, and so on, as well as Group I-III-VI, Group IV and Group III-V materials. Further, the semiconductor material of the second layer can have an index of refraction greater than a respective index of refraction of at least a portion of the mesh of carbon nanostructures embedded therein. The layers can have virtually any thickness, but in one embodiment, the first or second layers can have a thickness in a range of about 100 nm to 10 microns, and more preferably about 300 nm to 3000 nm. In some cases, the first and second layers can form a planar junction, although the junction can have other profiles as well. Further, the second layer can be spaced apart from the electrical contact (e.g., by a gap), and the carbon nanostructures can extend therebetween and can form an ohmic contact with the electrical contact.

The mesh can be formed of intertwined carbon nanostructures with interstitial spaces between them. The interstices can be sized such that electron-hole pairs generated therein are located no farther from any carbon nanostructure than about three, or in some cases two, diffusion lengths of photo-generated minority carriers in the semiconductor material included in the second layer. The mesh can be a patterned arrangement, or be un-patterned. The mesh can also be substantially randomly oriented along the width of the layer (e.g., the second layer). Further, a portion of the second layer, e.g., extending from the junction to a depth within the second layer, can be substantially devoid of carbon nanostructures. The depth can be less than about three diffusion lengths of photo-generated minority carriers in the semiconductor material included in the second layer.

Further Photovoltaic Devices and Methods

A wide variety of further embodiments are also disclosed. For example, another embodiment of an exemplary photovoltaic device includes a first semiconductor layer and a second light-responsive layer forming a junction, e.g., a junction with a depletion region, with the first layer. The second layer can comprise a semiconductor material and have a plurality of carbon nanostructures distributed in said second layer such that each of at least about 5% of said nanostructures are at least partially coated by the semiconductor material of the second layer. In other embodiments, at least about 10%, 25%, 50%, or 75% of the nanostructures can be at least partially coated by the semiconductor material.

In another embodiment, an exemplary photovoltaic device includes a first semiconductor layer and a second light-responsive layer forming a junction (e.g., a junction with a depletion region) with the first layer. The second layer can include a mesh of carbon nanostructures and a semiconductor material can be interstitially incorporated between the mesh of carbon nanostructures.

In yet another embodiment, an exemplary photovoltaic device includes a first semiconductor layer and a second light-responsive layer forming a junction (e.g., a junction with a depletion region) with the first layer. The second layer can include a plurality of carbon nanostructures where each, or in some cases a majority, of the carbon nano structures in the plurality of carbon nanostructures has at least a partial coating disposed thereon, and a light-responsive material can fill in the interstices between individual coated carbon nanostructures of the plurality of carbon nanostructures. In some embodiments, the coating can be made of a semiconductor material or an insulating material. In other embodiments, at least one of the coating and the light-responsive material (e.g., a semiconductor material) can have an index of refraction greater than a respective index of refraction of at least one of the plurality of carbon nanostructures. The coating can be crystalline as well.

In yet another embodiment, an exemplary photovoltaic device includes a first semiconductor layer and a second light-responsive layer forming a junction (e.g., a junction with a depletion region) with the first layer. The second layer can include a plurality of carbon nanostructures (which in some cases can form a mesh) and a semiconductor material that at least partially conformally coats at least some individual carbon nanostructures in the plurality of carbon nanostructures. Further, the at least partially conformally coated individual carbon nanostructures can be located throughout the second layer. In some embodiments, the semiconductor material can circumferentially coat a plurality of individual carbon nanostructures (e.g., carbon nanotubes) located in the second layer.

In yet another embodiment, an exemplary photovoltaic device includes a light-responsive layer comprising having a plurality of carbon nanostructures at least partially embedded therein, where individual carbon nanostructures in the plurality of embedded nanostructures are at least partially coated with a semiconductor material. In some embodiments, the coating and the light-responsive layer can form a junction with a depletion region. The light-responsive layer can include a light-responsive material filling in the interstices between the at least partially coated individual carbon nanostructures. Further, the plurality of carbon nanostructures can be coupled to an electrical contact, and the photovoltaic device can further include an insulating layer disposed between the light-responsive layer and the electrical contact.

In yet another embodiment, an exemplary photovoltaic device includes a first semiconductor layer and a second light-responsive layer forming a junction (e.g., a junction with a depletion region) with the first layer. The second layer can include a mesh of carbon nanostructures at least partially embedded therein, and at least one of said plurality of carbon nanostructures can have a vanishing band gap. In some embodiments, the vanishing band gap can be less than about 0.1 eV, and in other embodiments, the vanishing band gap can be less than about 0.01 eV.

In yet another embodiment, an exemplary photovoltaic device includes a first semiconductor layer and coupled to a first electrical contact and a second light-responsive layer forming a junction with the first layer, the junction including a depletion region. The second layer can include a plurality of carbon nanostructures at least partially embedded therein to provide a conductive path out of the second layer to a second electrical contact. Further, the photovoltaic device can exhibit an efficiency for conversion of incident solar energy to electrical energy equal to or greater than about 4 percent, or in other embodiments equal to or greater than about 8, 10, 12, 14, 16 or 18 percent.

Any of the foregoing embodiments can have a wide variety of other features. For example, the first and second layers can be made of semiconductor materials and can both be light-responsive. Possible semiconductor materials include Group II-VI semiconductor materials, such as CdS, CdO, CdSe, ZnS, CdTe, and so on, as well as Group I-III-VI, Group IV and Group III-V materials. Further, the semiconductor material of the second layer can have an index of refraction greater than a respective index of refraction of at least a portion of the mesh of carbon nanostructures embedded therein. The layers can have virtually any thickness, but in one embodiment, the first or second layers can have a thickness in a range of about 100 nm to 10 microns, and more preferably about 300 nm to 3000 nm. In some cases, the first and second layers can form a planar junction, although the junction can have other profiles as well. The second layer can be spaced apart from the electrical contact (e.g., by a gap), and the carbon nanostructures can extend therebetween and can form an ohmic contact with the electrical contact.

Further, in any of the foregoing embodiments, the carbon nanostructures can form a mesh, or the carbon nanostructures can also be aligned (e.g., upstanding, substantially vertically aligned, substantially aligned on angle, and so on). In many cases the carbon nanostructures can be carbon nanotubes (e.g., including single-wall or multi-wall tubes). The plurality of carbon nanostructures can have interstices therebetween, which can be sized such that electron-hole pairs generated in the interstices (e.g., in a semiconductor material located therein) are located no further than about three, or in some cases about one or about two, diffusion lengths from a carbon nanostructure, the diffusion length representing the diffusion length of photo-generated minority carriers in the semiconductor material included in the second layer. Further, a portion of the second layer, e.g., extending from the junction to a depth within the second layer, can be substantially devoid of carbon nanostructures. The depth can be less than about three diffusion lengths of photo-generated minority carriers in the semiconductor material included in the second layer.

Photovoltaic Devices and Flexible Substrates

In another embodiment, an exemplary photovoltaic device can include a plurality of photovoltaic elements disposed on a flexible substrate. At least one of the photovoltaic elements can include a first semiconductor layer and a second light-responsive layer forming a junction with the first layer, the junction including a depletion region. The second layer can include a mesh of carbon nanostructures at least partially embedded therein to provide a conductive path out of the second layer to an electrical contact. Further, a transparent conducting film can be disposed over the first layer. A flexible radiation-transparent layer can be disposed over the plurality of photovoltaic elements. In many embodiments, the resulting photovoltaic device is sufficiently flexible such that the substrate (and, e.g., the photovoltaic device) can be rolled around and unrolled from a 1 inch diameter cylinder without damage.

In another embodiment, an exemplary flexible photovoltaic film can include a flexible upper radiation transparent layer, a flexible lower substrate layer, and a plurality of photovoltaic devices disposed between the two layers. At least one of the photovoltaic layers can include a first semiconductor layer and a second light-responsive layer forming a junction with the first layer, the junction including a depletion region. The second layer can include a mesh of carbon nanostructures at least partially embedded therein to provide a conductive path out of the second layer to an electrical contact.

Any of the foregoing embodiments can have a wide variety of other features. For example, the first and second layers can be made of semiconductor materials and can both be light-responsive. Possible semiconductor materials include Group II-VI semiconductor materials, such as CdS, CdO, CdSe, ZnS, CdTe, and so on, as well as Group I-III-VI, Group IV and Group III-V materials. Further, the semiconductor material of the second layer can have an index of refraction greater than a respective index of refraction of at least a portion of the mesh of carbon nanostructures embedded therein. The layers can have virtually any thickness, but in one embodiment, the first or second layers can have a thickness in a range of about 100 nm to 10 microns, and more preferably about 300 nm to 3000 nm. In some cases, the first and second layers can form a planar junction, although the junction can have other profiles as well. The second layer can be spaced apart from the electrical contact (e.g., by a gap), and the carbon nanostructures can extend therebetween and can form an ohmic contact with the electrical contact.

Further, in any of the foregoing embodiments, the carbon nanostructures can form a mesh, or the carbon nanostructures can also be aligned (e.g., upstanding, substantially vertically aligned, substantially aligned on angle, and so on). In many cases the carbon nanostructures can be carbon nanotubes (e.g., including single-wall or multi-wall tubes). The plurality of carbon nanostructures can have interstices therebetween, which can be sized such that electron-hole pairs generated in the interstices (e.g., in a semiconductor material located therein) are located no further than about three, or in some cases about one or about two, diffusion lengths from a carbon nanostructure, the diffusion length representing the diffusion length of photo-generated minority carriers in the semiconductor material included in the second layer. Further, a portion of the second layer, e.g., extending from the junction to a depth within the second layer, can be substantially devoid of carbon nanostructures. The depth can be less than about three diffusion lengths of photo-generated minority carriers in the semiconductor material included in the second layer.

Photovoltaic Devices and Methods of Fabricating them

In one embodiment, an exemplary photovoltaic device can be fabricated by the process of activating at least a surface portion of a mesh of carbon nanostructures. In other embodiments, the process can include activating a surface portion of a plurality of carbon nanostructures (e.g., a mesh, an array of aligned nanostructures, a carpet, as mentioned in previous embodiments, and so on). The process can further include catalyzing growth of a first semiconductor material on the activated portions so as to at least partially coat the mesh with the first semiconductor material, the coated mesh forming at least part of a first light-responsive semiconductor layer; and catalyzing growth of a second semiconductor material on the coated carbon nanostructures so as to form at least part of a second light-responsive semiconductor layer, the first and second layers forming a junction with a depletion region.

In another embodiment, an exemplary photovoltaic device can be fabricated by the process of immersing a mesh of carbon nanostructures in a chemical bath so as to catalyze growth of a semiconductor coating on the plurality of carbon nanostructures, the coated carbon nanostructures forming at least part of a first light-responsive semiconductor layer; and immersing the coated mesh of carbon nanostructures in a second chemical bath so as to catalyze growth of a second semiconductor material on the mesh, the second semiconductor material forming at least part of a second light-responsive semiconductor layer. The first and second layers can form a junction with a depletion region.

In yet another embodiment, an exemplary photovoltaic device can be fabricated by the process of chemically functionalizing at least a surface portion of a mesh of carbon nanostructures disposed in a liquid; catalyzing growth of a first semiconductor material on the functionalized surface portions so as to at least partially coat the mesh of carbon nanostructures with the first semiconductor material, the coated mesh forming at least part of a first light-responsive semiconductor layer; and catalyzing growth of a second semiconductor material on the coated mesh so as to form at least part of a second light-responsive semiconductor layer. The first and second layers can form a junction with a depletion region.

Any of the foregoing embodiments can have a wide variety of other features. For example, the process can further include catalyzing growth of the first semiconductor material so as to form a substantially planar surface for forming the junction. The process also can include coupling the plurality of carbon nanostructures to an electrical contact, coupling the second layer to another electrical contact, and/or coupling at least one of the first and second layers to a flexible substrate. The coating of the mesh can include coating individual nanostructures within the mesh, and/or incorporating the second semiconductor material in the interstices between individual carbon nanostructures in the mesh.

Further, the first and second layers can be made of semiconductor materials and can both be light-responsive. Possible semiconductor materials include Group II-VI semiconductor materials, such as CdS, CdO, CdSe, ZnS, CdTe, and so on, as well as Group I-III-VI, Group IV and Group III-V materials. Further, the semiconductor material of the second layer can have an index of refraction greater than a respective index of refraction of at least a portion of the mesh of carbon nanostructures embedded therein. The layers can have virtually any thickness, but in one embodiment, the first or second layers can have a thickness in a range of about 100 nm to 10 microns, and more preferably about 300 nm to 3000 nm. In some cases, the first and second layers can form a planar junction, although the junction can have other profiles as well. The second layer can be spaced apart from the electrical contact (e.g., by a gap), and the carbon nanostructures can extend therebetween and can form an ohmic contact with the electrical contact.

Photovoltaic Devices and Semiconductor Nanostructures

In one embodiment, an exemplary photovoltaic device includes a first semiconductor layer and a second light responsive layer disposed adjacent the first layer so as to form a junction therewith, the junction having a depletion region. The photovoltaic device further can include a plurality of carbon nanostructures distributed in the second layer and a plurality of semiconductor nanostructures disposed on at least some of the carbon nanostructures. The semiconductor nanostructures can exhibit a bandgap less than a bandgap of the second semiconductor layer.

In some embodiments, the difference between the band gap of the semiconductor nanostructures and that of the second layer can be in a range of about 0.1 eV to about 1 eV. Further, the first layer can exhibit a band gap greater than that a band gap of the second layer.

The carbon nanostructures can be carbon nanotubes, such as single-wall carbon nanotubes or multi-wall carbon nanotubes. The carbon nanostructures can exhibit a vanishing band gap.

The first and second layers can be light-responsive and can include semiconductor materials. For example, they can be each be formed of a Group IV, III-V, Group I-III-VI, or Group II-VI (e.g., CdSe) semiconductor material. The semiconductor nanostructures can also be formed of a Group II-VI semiconductor material such as CdTe.

In some embodiments, the semiconductor nanostructures and the second layer exhibit similar conductivity types. For example, both of the semiconductor nanostructures and the second layer can include an n-type dopant (e.g., to form an n-type CdSe), and the first layer can include a p-type dopant (e.g., to form a p-type CdTe). As another example, at least some of the semiconductor nanostructures include an n+-type material and the second layer includes an n-type material.

The photovoltaic device can further include a transparent electrically conductive layer disposed on at least a portion of the first layer. The transparent conductive layer can form an ohmic contact with the first layer. The photovoltaic device can further include another electrical contact layer disposed on at least a portion of the second layer so as to form ohmic contact with at least some of the carbon nanostructures and the second layer.

In another embodiment, an exemplary photovoltaic device can include a first semiconductor layer and a second light responsive layer disposed adjacent said first layer to form a junction therewith, the junction including a depletion region. The photovoltaic device can also have a plurality of carbon nanostructures (e.g., carbon nanotubes) distributed in at least one of the layers, and a plurality of compound nanostructures disposed on at least some of the carbon nanostructures. The compound nanostructures can include a carbon bucky ball and a semiconductor shell at least partially coating the bucky ball.

The first and second layers can be made of semiconductor materials and can both be light-responsive. The carbon bucky balls in the compound nanostructure can be formed of any of $C_{60}$, a $C_{70}$, $C_{84}$, $C_{96}$, $C_{108}$, and $C_{120}$ molecule. Further, the shell of the compound nanostructure can have a thickness in a range of about 1 nm to about 100 nm. The shell can be formed of a material having a lower bandgap than the band gap of the semiconductor layer in which the carbon nanostructures are distributed.

In yet another embodiment, an exemplary photovoltaic device can include a first semiconductor layer and a second light responsive layer disposed adjacent the first layer to form a junction therewith, the junction having a depletion region. The photovoltaic device can further include a porous insulating layer disposed adjacent the second layer and an electrically conductive layer disposed adjacent the insulator layer, with the insulator layer providing electrical insulation between the conductive layer and the second layer. The photovoltaic device can further include a mesh of carbon nanostructures distributed in the second layer such that at least some of the carbon nanostructures extend through the pores of the porous insulator layer to form an ohmic contact with the electrically conductive layer. The photovoltaic device can also have a plurality of composite nanostructures each having a core comprising a carbon nanostructure and a shell comprising a semiconductor distributed over the mesh of carbon nano structures.

The first and second layers can be made of semiconductor materials and can both be light-responsive. The carbon nanostructures of the mesh can be carbon nanotubes (e.g., single-wall nanotubes or multi-wall nanotubes), and the carbon nanostructures of the composite nanostructures can be carbon bucky balls. Further, the semiconductor shells of the composite nanostructures can exhibit a conductivity type similar to that of the second layer.

In yet another embodiment, an exemplary photovoltaic device can include a light responsive layer and a plurality of compound nanostructures distributed in the layer. Each of the compound nanostructures can include a carbon nanostructure, a plurality of semiconductor nanostructures disposed on an outer surface of the carbon nanostructure (e.g., so as to form junctions with the light responsive layer, the junction having depletion regions), and an insulating material coating portions of the outer surface of the carbon nanostructure located between the semiconductor nanostructures.

The light-responsive layer can include a semiconductor material. In some embodiments, the semiconductor material in the light-responsive layer and that included in the semiconductor nanostructures can have different conductivity types.

The photovoltaic devices can further include an electrical contact layer adapted to form an ohmic contact with the carbon nanostructures. Also, the photovoltaic devices can further include an insulator coating providing electrical insulation between the light responsive layer and the electrical contact layer. The insulator coating can have a plurality of pores distributed therein through which said compound nanostructures form an ohmic contact with the electrical contact layer.

The carbon nanostructures can include, for example, carbon nanotubes, including any of single wall or multiwall carbon nanotubes. The semiconductor nanostructures can include a core formed of a carbon nanostructure, and a shell formed of a semiconductor material. The shell can have any of a wide range of thicknesses. However, in one embodiment, for example, the shell can have thickness in a range of about 1 nm to about 100 nm, in a range of about 1 nm to about 50 nm, in a range of about 1 nm to about 30 nm, a range of about 1 nm to about 20 nm, or in a range of about 1 nm to about 10 nm.

Photovoltaic Devices and Semiconducting Carbon Nanotubes

In another embodiment, the present invention provides a photovoltaic device which comprises a light-responsive layer having a plurality of semiconducting carbon nanostructures (e.g., the carbon nanostructures can comprise single-wall carbon nanotubes, and in other embodiments they can comprise multi-wall carbon nanotubes which have been doped, for example) distributed within a semiconductor material (a bulk semiconductor material, for example) such that at least some of the carbon nanostructures form a plurality of distributed junctions (e.g., p-n junctions or other heterojunctions) with the semiconductor material. Each junction includes a charge depletion region that can facilitate the separation of electron-hole pairs generated in the vicinity thereof in response to radiation incident on the semiconductor material.

In some embodiments, the semiconductor material can be an intrinsically n-type material (such as CdSe) and/or can be doped with an n-type dopant, such as silicon doped with arsenic or gallium arsenide doped with antimony, while the semiconducting carbon nanostructures can comprise p-type semiconducting carbon nanostructures. In other embodiments, the semiconductor material can be an intrinsically p-type material or doped with a p-type dopant, while the semiconducting carbon nanostructures can comprise n-type semiconducting nano structures.

In a related aspect, the semiconducting carbon nanostructures, or at least a portion thereof, can provide an electrically conductive path out of the light-responsive layer to a back electrical contact. Further, the photovoltaic device can include an insulating layer (e.g., disposed between the back electrical contact and the bulk of the semiconductor material) having a plurality of pores or openings, through which at least some of the semiconducting carbon nanostructures extend to the back electrical contact to form an electrical coupling therewith. The device can also include a front electrical contact that is in electrical coupling with the semiconductor material. The front electrical contact is preferably formed from electromagnetic-radiation transmissive materials (e.g., ZnO) to allow the passage of radiation (e.g., solar radiation) incident thereon to the semiconducting material.

In some cases, the semiconducting carbon nanostructures form a mesh of intertwined nanostructures (e.g. a mesh of intertwined carbon nanotubes). In other cases, the nanostructures can be embedded in the semiconducting material as substantially aligned, upstanding, and/or a vertical array of carbon nanotubes or other structures.

In some embodiments, at least some of the semiconducting carbon nanostructures exhibit a bandgap in a range of about 0.16 eV to about 1.6 eV. Further, in some cases at least some of the carbon nanostructures can have diameters in a range of about 0.5 nm to about 5 nm.

In a related aspect, the thickness of the light responsive layer can be in a range of about 300 nm to about 3000 nm. Further, in some embodiments, the semiconductor material can comprise any of Group II-VI, Group III-V, Group IV, and Group I-III-VI semiconductor material doped with a suitable dopant. By way of example, the semiconductor material can be n-type CdSe.

In some cases, the semiconductor material has an index of refraction that is greater than a respective index of refraction of at least some of the semiconducting carbon nanostructures. Further, in some cases, a plurality of carbon nanostructures that exhibit a vanishing band gap (e.g., multi-wall carbon nanotubes) are distributed in the semiconducting material such that at least some of the vanishing band gap carbon nano structures are in electrical contact with at least some of the semiconducting carbon nanostructures.

In another aspect, a photovoltaic device is provided that comprises a light responsive layer including an n-type semiconductor material, and a plurality of p-type semiconducting carbon nanostructures embedded in the n-type semiconductor material so as to form a plurality of distributed p-n junctions therewith. At least a portion of the light-responsive layer is configured for exposure to an external source of radiation (e.g., solar radiation) having one or more wavelengths suitable for generating electron-hole pairs in the semiconductor material. The distributed p-n junctions facilitate separation of at least some of the photogenerated electron-hole pairs such that at least some of the separated holes migrate to the carbon nanostructures. At least some of the carbon nanostructures form a conductive path out of the semiconductor material to an electrical contact, which receives some of the separated holes via the nanostructures. Another electrical contact that is electrically coupled to the semiconductor material can receive at least some of the separated electrons via diffusion through the semiconductor material. In this manner, a voltage can be generated across the electrodes in response to exposure of the light-absorbing layer to incident radiation. In some cases, an external load can be coupled across the electrical contacts such that the photogenerated voltage causes a current through the load.

Photodetectors

In another aspect, a photodetector is provided that comprises a light-responsive layer including a plurality of semiconducting carbon nanostructures distributed within a semiconductor material so as to form one or more junctions (e.g., distributed junctions) each of which is characterized by a charge depletion region. The carbon nanostructures can include, e.g., single-wall carbon nanotubes, or multi-wall carbon nanotubes that have been doped, for example. A first electrode is in electrical coupling with the semiconductor material and a second electrode is in electrical coupling with the carbon nanostructures. Further, an external load is electrically coupled between the two electrodes. The exposure of the light-responsive layer to radiation having one or more suitable wavelengths (e.g., wavelengths suitable for generating electron-hole pairs in the semiconductor material) can cause a change in a current flowing through the external load.

In a related aspect, the above photodetector can exhibit a responsivity in a range of about 0.1 amperes/watts (A/W) to about 0.5 A/W. In some cases, a bias voltage, e.g., a voltage in a range of about 0 to about 2 volts, can be applied to the light-absorbing layer via the two electrodes to appropriately bias the distributed junctions in order to enhance the responsivity of the photodetector. Other features from previously-described photovoltaic devices can be incorporated as well into such a photodetector (e.g., the carbon nanotubes can form a mesh, the junctions can be p-n junctions, and so on.)

In another aspect, a photodetector is disclosed that includes a light-responsive layer having a plurality of semiconducting carbon nanostructures distributed within a semiconductor material such that at least some of the carbon nano structures form one or more junctions (e.g., distributed junctions) at their interface(s) with the semiconductor material. Each junction can be associated with a charge depletion region characterized by an electric field that facilitates the separation of electron-hole pairs generated in at least a portion of the semiconductor material in response to incident radiation. The photodetector further includes two electrodes, one of which is in electrical coupling with the semiconductor material and the other is in electrical coupling with the carbon nanostructures. The light responsive layer effects the generation of a voltage across the electrodes in response to exposure of at least a portion of the semiconductor material to incident radiation. In some cases, the generated voltage can be employed as an electrical signal in subsequent circuitry of the photodetector to indicate the intensity of the detected radiation.

In some embodiments, the above photodetector can detect radiation having one or more wavelengths in a range of about 350 nm to about 712 nm, in some cases a range or about 300 nm to about 750 nm, and in some cases in a range of about 400 nm to about 2000 nm. Other features from previously-described photovoltaic devices can be incorporated as well into such a photodetector (e.g., the carbon nanotubes can form a mesh, the junctions can be p-n junctions, and so on.)

BRIEF DESCRIPTION OF THE DRAWINGS

The devices discussed herein will be more fully understood from the following detailed description taken in conjunction with the accompanying drawings, in which.

DETAILED DESCRIPTION

Certain exemplary embodiments will now be described to provide an overall understanding of the principles of the structure, function, manufacture, and use of the devices and methods disclosed herein. One or more examples of these embodiments are illustrated in the accompanying drawings. The devices and methods specifically described herein and illustrated in the accompanying drawings are non-limiting exemplary embodiments, as the scope of the present application is defined solely by the claims. Throughout this application, the term "e.g." will be used as an abbreviation of the non-limiting phrase "for example."

A variety of embodiments will be presented herein. It should be understood that the features illustrated or described in connection with one exemplary embodiment may be combined with the features of other embodiments. Such modifications and variations are intended to be included within the scope of the present disclosure.

Generally, the devices and methods disclosed herein provide improved photovoltaic cells for converting light, including in particular sunlight, to electrical energy. It should be understood that the terms "light" and "radiation" are used interchangeably herein to refer to both visible and invisible radiation. These devices and methods have a wide range of applications, including in both terrestrial and extra-terrestrial settings, and can be incorporated into panels, arrays, flexible films, sheets, or other products.

Figure 1:
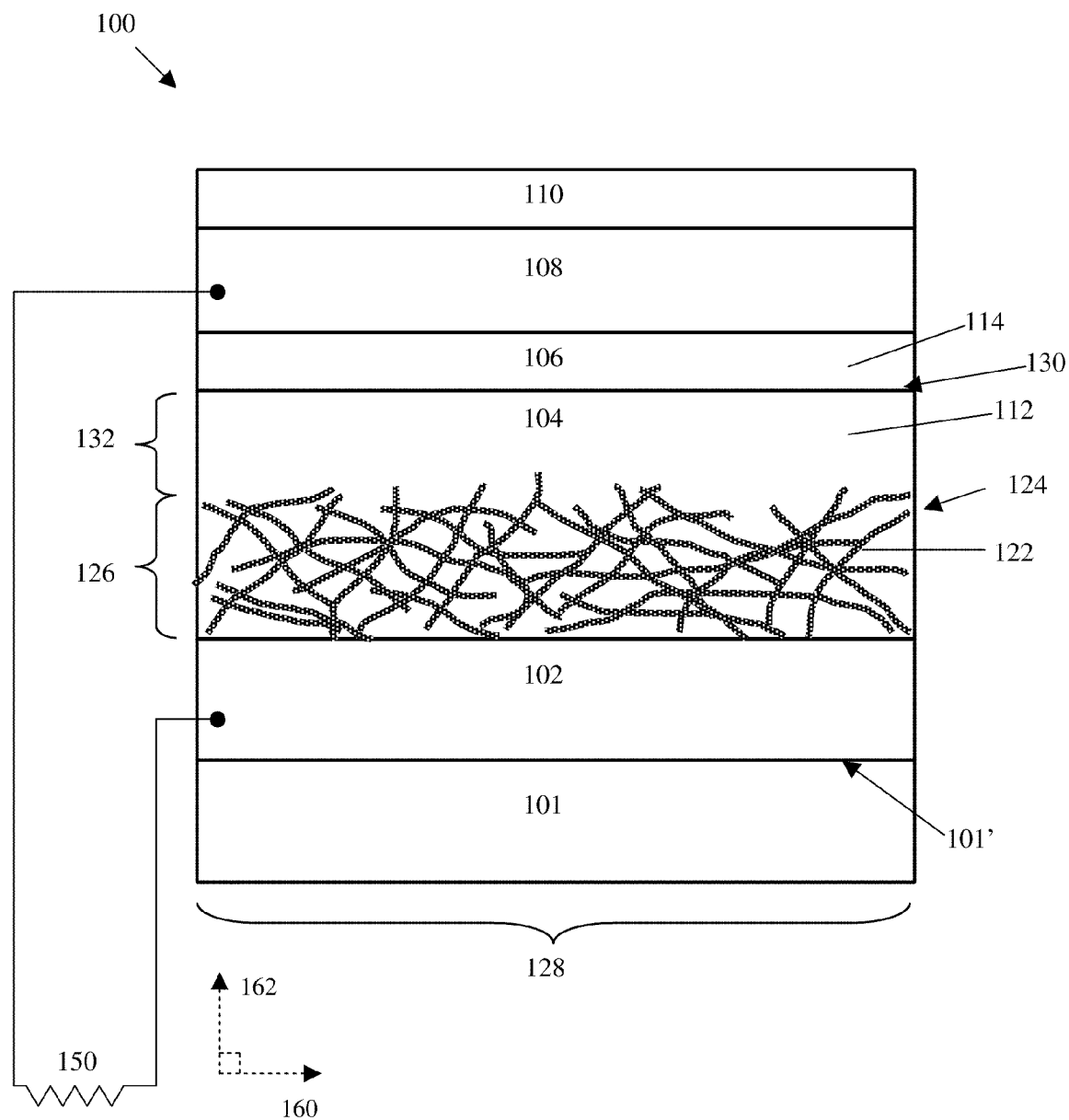
FIG. 1 is a schematic view of an exemplary photovoltaic device which includes a window layer and an absorption layer with a mesh of carbon nanostructures embedded therein, the window layer and the absorption layer forming a junction.

FIG. 1 schematically illustrates one embodiment of a photovoltaic device 100. In this case, the photovoltaic device 100 includes a substrate 101, a back electrical contact 102, an absorption layer 104, a window layer 106, a top electrical contact 108, and an anti-reflective coating 110.

Typically, the absorption layer 104 is a light-responsive layer—that is, it is capable of generating electron-hole pairs in response to light of suitable wavelengths incident thereon. The bulk of the absorption layer 104 can be formed from a semiconductor material 112. The bulk of the window layer 106 can also be made of a semiconductor material 114, and can also be light-responsive. In many embodiments, the semiconductor materials 112 and 114 are of differing conductivity types. As is known in the art, the conductivity type of a material refers to the type of charge carrier (e.g., electron or hole) that is predominantly responsible for electrical conduction in the material. The junction between two materials formed of different conductivity types can be characterized by a depletion region that supports an electric field, while the junction between two materials formed of similar conductivity types does not produce a depletion region. By way of example, the absorption layer 104 can be made of n-type CdSe while the window layer 106 can be made of p-type CdS, thus forming a p-n junction 130. As is well known in the art, a p-n junction can have certain characteristics, including the aforementioned depletion region, an electric field and built-in voltage, all of which follow from the chosen semiconductor materials and doping profiles, among other things. As one skilled in the art will understand, a variety of semiconductors (e.g., Group II-VI, Group IV, or Group III-V) and dopants can be used. In some embodiments, the junction 130 can be a p-i-n junction that is formed by the junction of a p-type material, an intrinsic layer (e.g., an undoped or lightly doped semiconductor material), and an n-type material.

In FIG. 1, the absorption layer 104 has a plurality of nanostructures embedded therein. In this embodiment, the nanostructures are carbon nanotubes 122, although a wide variety of carbonaceous or other nanostructures can be used. The term nanostructure is used herein to refer to a material structure having a size in at least one dimension (e.g., a diameter of a tube, or a length, width or thickness of another structure such as a graphene sheet) that is less than about 1 micron, in other embodiments less than about 500 nm, about 100 nm, about 20 nm or about 1 nm. As shown, the plurality of carbon nanotubes 122 form a mesh 124, which can be made up of many intertwined and/or interconnected carbon nanotubes 122. For descriptive purposes, the mesh 124 can be said to have an aspect ratio defined by a height 126 taken in a direction substantially normal to the substrate surface 101' (a vertical direction 162 in FIG. 1) and a width taken in a direction substantially parallel to the substrate surface 101' (a horizontal direction 160 in FIG. 1). The carbon nanotubes 122 can be randomly distributed across their width 128. In some cases, the carbon nanotubes 122 in the mesh can be substantially horizontally oriented (as shown in FIG. 1) such that the nanotubes predominantly extend farther in horizontal direction 160 than in vertical direction 162, although this is not necessary. The individual nanotubes 122 in the mesh 124 can be in contact (e.g., ohmic contact) with other nanotubes 122 along a portion of their surfaces, creating a network of interconnected nanotubes 122. Ohmic contact is known in the art; however, to the extent that any additional explanation is necessary, ohmic contact refers to contact that allows exchange of charge carriers therebetween (e.g., a flow of electrons) and is characterized by a substantially voltage independent resistance. In many embodiments, the mesh 124 can provide a network of conductive pathways within the absorption layer 104.

Although the mesh 124 is illustrated as an arrangement of carbon nanotubes 122 without a discernible pattern, in other embodiments an organized mesh, e.g., a patterned mesh, can be used. In addition to whatever other characteristics (e.g., electrical conductivity) it may provide, such a mesh can be used as a physical template or screen for the fabrication of layers, semiconductor nanostructures, or other features in the device 100, as will be discussed in more detail below.

Figure 2:
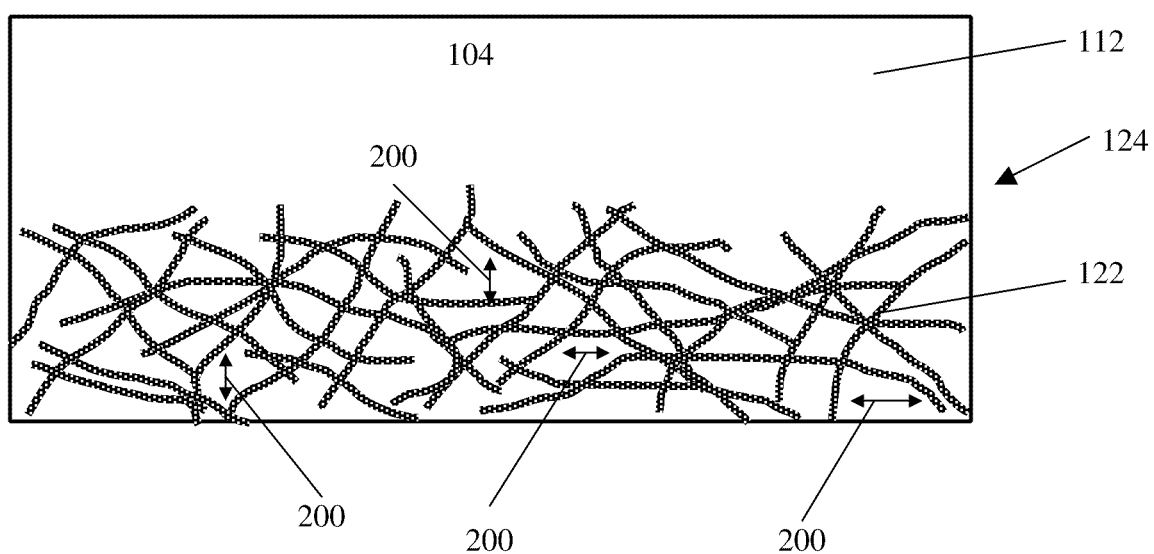
FIG. 2 is a detail view of the mesh of carbon nanostructures shown in FIG. 1.

The density of the mesh 124 can vary widely. However, in some embodiments, the density of the carbon nanotubes 122 of the mesh 124 can be adjusted such that the interstitial spacing between neighboring nanotubes produces desirable properties. For example, as shown in FIG. 2, the spacing 200 between adjacent carbon nanotubes 122 in the mesh 124 can be less than about three diffusion lengths exhibited by photogenerated minority charge carriers (e.g., upon photo-excitation) in the semiconductor material 112 in which the mesh 124 is embedded, and more preferably less than about two diffusion lengths. It should be understood that while FIG. 2 is a two-dimensional illustration, in a three-dimensional device the interstitial spacing 200 can represent the distance across three-dimensional voids separating carbon nanotubes 122 in the mesh 124.

As shown in FIG. 1, the carbon nanotubes 122 in the mesh 124 can be coated with the semiconductor material 112. In many cases, the semiconductor material 112 conformally coats individual nanotubes 122 in the mesh 124. A conformal coating can take the shape of the contours and/or underlying three-dimensional profile of the carbon nanotubes 122, and in some cases can cover surfaces of the carbon nanotubes 122 in many or substantially all directions, e.g., in the nature of a circumferential coating. In some embodiments, the coating can at least partially cover at least about 5 percent of the nanotubes 122 (or other nanostructures) in the material; in other embodiments, between 5 and 100 percent of individual nanotubes are at least partially coated. More narrow ranges are possible. For example, the coating can at least partially cover 5 and 10 percent of carbon nanotubes, between 5 and 20 percent, between 5 and 30 percent, about 40 percent, about 50 percent, about 75 percent, and so on.

The semiconductor material 112 can also fill in the spaces between carbon nanotubes 122, such as the spaces 200 and/or three-dimensional voids discussed above in connection with FIG. 2. In FIG. 1, the semiconductor material 112 coating on the carbon nanotubes 122 has been built up such that it covers the mesh 124. In a three dimensional device, the junction 130 can be substantially planar. However, in other embodiments, the semiconductor material 112 can coat the nanotubes 122 without being built up, and a window layer can be disposed on top of the coated nanotubes 122 to create a non-planar junction, as will be discussed in more detail below in connection with FIG. 3.

The semiconductor material 112 coating the carbon nanotubes 122 can be crystalline, including both single-crystal and/or polycrystalline coatings, and e.g., hexagonal phase crystalline CdSe. In some cases, a region of crystalline material (e.g., single crystal) can surround the carbon nanotubes and/or each individual carbon nanotube. In some cases, other regions (e.g., regions beyond this surrounding crystalline region) can be polycrystalline or amorphous. However, in other embodiments, a substantial portion of the bulk of the absorption layer 104 can be crystalline (e.g., 80% or more). Crystalline regions can have advantageous electrical properties, e.g., they can promote high-efficiency current generation and collection in the absorption layer 104. In many embodiments, the foregoing semiconductor materials and coatings can be fabricated using chemical bath deposition (CBD) procedures, which will be described in more detail below.

The carbon nanotubes 122 can be coupled to the back electrical contact 102, e.g., electrostatically or via an adhesive material, such that the carbon nanotubes 102 form a contact (e.g., an ohmic contact) to the back electrical contact 102. The back electrical contact 102 (and/or substrate 101) can have a roughened or textured top surface so as to improve the anchoring of the carbon nanotubes 122 thereto. By way of example, the top surface can include micron or sub-micron sized undulations or can be a porous surface, e.g., with micron or sub-micron sized pores. Such a textured or roughened surface can be created using a variety of techniques, as will be described in more detail below.

In many cases, the back electrical contact 102 is formed from an electrically conductive material. It can be rigid or flexible, transparent or opaque. For example, the electrical contact 102 can be a film of electrically conducting material (e.g., a metal such as aluminum or copper) disposed atop a substrate 101, which itself can be rigid (e.g., a glass substrate) or flexible (e.g., plastic). The back electrical contact 102 can also take the form of trace connections atop (e.g., patterned and deposited metals) or through the substrate 101 (e.g., drilled through the substrate 101). Further, in some embodiments, the back electrical contact 102 and the substrate 101 can be combined, as they need not be separate components or materials. The use of flexible electrical contacts 102 and/or substrates 101 can be advantageous for producing flexible photovoltaic films. The flexibility of such films, and of such electrical contacts 102 and/or substrates 101, can be such that the film can be rolled and unrolled, e.g., for transport, storage, and installation. In some embodiments, the flexibility of the back electrical contact 102 and/or substrate 101 can be such that will allow them to be rolled around and unrolled from a 1 inch diameter cylinder repeatedly without damage.

Returning to FIG. 1, a top electrical contact 108 can be disposed over the window layer 106. The top electrical contact 108 can be a layer formed from a transparent conductive polymer (TCP), metal oxide, or polyimide, or can have any of a wide variety of other configurations, including an arrangement of fine metal lines as is known in the art. In many embodiments, the top contact can be radiation-transparent (for example, transparent to solar radiation, which can include radiation having a wavelength in a range of about 200 nm to 2.5 microns). The top electrical contact 108 also can be configured as previously described with respect to the back electrical contact 102. An anti-reflective coating 110, such as a silicon oxynitride thin film, can be disposed over the window layer 106 and the top electrical contact 108. The photovoltaic device 100 can be coated with or encapsulated in a protective material (e.g., to provide physical and/or environmental protection), such as a transparent polymer or PTFE. The anti-reflective coating 110 and protective material are typically radiation-transparent.

In use, and without being limited by theory, the device 100 can be exposed to solar radiation that passes through the top electrical contact 108 without any substantial absorption to reach the window layer 106. Some of the photons passing through the window layer 106 can be absorbed by the semiconductor material 114 of that layer to generate electron-hole pairs. Other incident photons pass through that layer 106 to be absorbed by the semiconductor material 112 of the absorption layer 104 so as to generate electron-hole pairs therein. The generation of electron-hole pairs occurs, e.g., by promoting an electron in the valence band of the material to its conduction band. As previously mentioned, and for explanatory purposes only, the absorption layer 104 can be made of n-type semiconductor (e.g., CdSe), while the window layer can be made of p-type semiconductor (e.g., doped CdS). In such an embodiment, the electric field in the junction 130 causes the separation of such electron-hole pairs in the vicinity thereof. Electrons can travel across the junction 130 to the n-type semiconductor and the holes can travel across the junction 130 to the p-type semiconductor. Additionally, electron-hole pairs are photo-generated outside the vicinity of the depletion region in both the absorption layer 104 and window layer 106. Such electrons and holes can move (e.g., diffuse, as dictated by factors such as carrier concentration and thermal effects in the semiconductor) within the absorption layer 104 and window layer 106, as the case may be. This movement can be quantitatively described by their diffusion lengths (e.g., average distance traveled by a charge carrier before recombination).

Whether generated inside or outside the vicinity of the junction 130, photogenerated electrons can migrate (e.g, via diffusion) through the n-type absorption layer 104 to the carbon nanotubes 122 of the mesh 124 (e.g., before recombining). The carbon nanotubes 122 can provide a conductive pathway out of the absorption layer 104 to the back electrical contact 102, which can reduce the chances that an electron will recombine with a hole before it can exit the absorption layer 104. (In this embodiment, electrons can also pass directly from the absorption layer 104 to the back electrical contact 102.) The removal of electrons can also reduce the recombination rate for holes in the absorption layer 104 by reducing the number of electrons with which they can recombine, which enhances the probability of reaching the depletion region of the junction 130 and the p-type window layer 106. Photogenerated holes can migrate through the p-type window layer 106 to the top electrical contact 108. The electrons in the back electrical contact 102 can travel through an external load 150 to the p-type window layer 106 to recombine with the holes that have migrated through the window layer 106. This flow of electrons represents a current which, in conjunction with the built-in potential of the junction 130, represents electrical power.

As one skilled in the art will understand, in other embodiments the absorption layer 104 can be made of p-type material, while the window layer can be made of n-type material, and the operation of such a device will change accordingly. In such an embodiment, photo-generated electrons in the window layer 106 travel to the top electrical contact 108, through an external load 150, and through the back electrical contact 102 and the carbon nanotubes 122 to recombine with holes in the p-type absorption layer 104.

Without being limited by theory, in many cases, the mesh 124 of carbon nanotubes 122 (or other carbon nanostructures) in the photovoltaic device 100 can provide a conductive pathway and thereby reduce recombination of generated electron-hole pairs in the absorption layer 104, for example, by allowing free electrons a low-resistance path out of the absorption layer 104 to the back electrical contact 104. Further, as noted above, in many embodiments, the density of the carbon nanotubes 122 forming the mesh 124 is sufficient to ensure that a charge carrier (e.g., an electron) generated in the interstitial space between the carbon nanotubes 122 is likely to reach a carbon nanotube 122 before recombining (e.g., with a hole) or undergoing other absorption and/or scattering event that would prevent them from flowing out of the absorption layer 104 to the external load 150. Use of carbon nanotubes 122 can enable a relatively thick absorption layer (which can be advantageous, e.g., for absorbing a greater proportion of incident radiation) to have the same or a lower electron-hole recombination rate as a relatively thin absorption layer (which can be advantageous to enhance efficiency of the device). In short, the device 100 can have the advantages of a thick absorbing layer with the lower recombination rate of a thin absorbing layer.

A wide variety of materials can be used in the photovoltaic device 100. As previously mentioned, the absorption layer 104 and window layer 106 can be formed from semiconductor materials 112, 114, including both single-element or compound semiconductors. Typically, the absorption layer 104 and window layer 106 can have differing conductivity types so that the junction therebetween can form a depletion region. Solely by way of non-limiting example, some potential Group II-VI semiconductors which can be used for the layers 104, 106 include CdSe, CdS, CdO, ZnS, CdTe, ZnO, ZnSe, CuSe, and ZnTe. Group IV and III-IV semiconductors, or other semiconducting materials, also can be used. In addition, in some embodiments, alternative materials can be substituted for the Group II material in a nominally Group II-VI compound semiconductor, e.g., a Group I-III-VI semiconductor. For example, Copper Indium di-Selenide ($CuInSe_2$) can be used, with the Copper Indium compound substituting for Cadmium (Group II) in its pairing with Selenium (Group VI) to create a Group I-III-VI semiconductor. The absorption and windows layers 104, 106 can include different semiconductor materials (e.g., n-type CdSe for the semiconductor material 112 in the absorption layer 104 and p-type CdS, CuSe, or ZnTe for the semiconductor material 114 in the window layer 106, or vice versa). In other embodiments, the absorption and windows layers 104, 106 can include the same semiconductor material, doped to be of differing conductivities (e.g., n-type CdSe for the semiconductor material 112 in the absorption layer 104 and p-type CdSe for the semiconductor material 114 in the window layer 106, or vice versa). As one skilled in the art will understand, the chosen semiconductor materials and dopants can vary. Typically, some Group II-VI materials are intrinsically n-type (that is, without doping), such as CdSe and CdS. Others typically are intrinsically p-type (that is, without doping), such as CdTe and ZnTe. Such materials need not be doped; however, in many embodiments dopants such as Cu can be used as a p-type dopant (e.g., to change CdSe to a p-type material via appropriate dosages).

The thickness of the absorption layer 104 and window layer 106 can vary widely and be designed to achieve suitable absorption of incident radiation. However, in one embodiment, the absorption layer 104 can have a thickness in a range of about 100 nm to 10 microns, and more preferably each can have a thickness in a range of about 300 nm to 3000 nm. The window layer 106 can have a thickness in a range of about 10 nm to 10,000 nm, and preferably 50 to 2000 nm, and more preferably about 50 nm to 500 nm. Referring to FIG. 1, the mesh 124 of carbon nanotubes 122 embedded in the absorption layer 104 can extend virtually to any height 126 within the layer. A region 132 of the absorption layer, preferably adjacent the junction 130, can be substantially devoid of nanostructures. Although the region 132 devoid of nanostructures can have virtually any thickness, it is preferably thicker than the depletion region of the junction 130 within the absorption layer 104. Further, while it is not necessary, the region 132 preferably can have a thickness that is less than about three, or in some cases about two, diffusion lengths of photo-generated minority carriers in the semiconductor material included in the second layer. For example, in one embodiment the mesh 124 of carbon nanostructures 122 can extend to a height 162 of about 500 nm within the absorption layer 104, and a region 132 devoid of nanostructures can be about 500 nm thick, which can result in an overall absorption layer 104 thickness of about 1000 nm. However, all such dimensions are merely by way of illustration and can vary widely.

It should be understood that while FIG. 1 is shown with an absorption layer 104 and window 106, multiple layers can be included. For example, additional absorption layers and/or window layers can be disposed above the window layer 106 (or in other embodiments, below the absorption layer 104) to form a multiple-junction device. Such additional layers can include nanostructures such as carbon nanotubes 122 embedded therein, but need not do so.

As previously mentioned, the nanostructures shown in FIG. 1 can be a mesh 124 of carbon nanotubes 122, which can be multi-wall carbon nanotubes or single-wall carbon nanotubes. A wide variety of other nanostructures (both carbon and non-carbon) also can be used, including cylindrical, spherical, elongate, ovoid, oblate, and other shapes, as well as carbon nanostructures formed from $C_{60}$ molecules, $C_{72}$ molecules, $C_{84}$ molecules, $C_{96}$ molecules, $C_{108}$ molecules, or $C_{120}$ molecules. In many embodiments, carbon nanostructures are formed primarily of carbon atoms (e.g., carbon can constitute 90% or more of a nanostructure's composition). However, they can include other constituents, for example, a plurality of catalyzing iron atoms from carbon nanostructure fabrication. In some embodiments, the nanostructures can include graphene structures. For example, the mesh 124 can comprise a mesh of one more graphene structures. Typical graphene structures are planar sheets or platelets with a thickness of one-atom. The length and width of such graphene structures can vary widely, but in one embodiment they can have a width of about 150 nm and a length of about 100 nm to about 1000 nm.

The fabrication of carbon nanostructures, including single and multi-wall carbon nanotubes, is known in the art. By way of example, carbon nanotubes can be fabricated using a variety of techniques, including chemical vapor deposition, laser-ablation, and arc discharge. Methods of fabricating carbon nanotubes are disclosed in more detail in U.S. Pat. Nos. 7,125,534 (Smalley et al., "Catalytic growth of single- and double-wall carbon nanotubes from metal particles"), 7,150,864 (Smalley et al., "Ropes comprised of single-walled and double-walled carbon nanotubes") and 7,354,563, (Smalley et al., "Method for purification of as-produced fullerene nanotubes"), which are hereby incorporated by reference in their entirety. Further, suitable carbon nanostructures can be obtained from commercial suppliers, such as Nanocyl of Sambreville, Belgium (US office in Rockland, Mass., USA), Bayer Materials Science AG of Leverkusen, Germany, and Showa Denko K.K. of Japan. Graphene can be fabricated according to known techniques. One such techniques involves unrolling a carbon nanotube (e.g., a multiwalled carbon nanotube) to create a graphene sheet. Other techniques are described, for example, in U.S. Patent Publication No. 2008/0279756 (Zhamu et al., "Method of producing exfoliated graphite, flexible graphite, and nano-scaled graphene platelets," discussing a method of fabricating graphene that involves a) dispersing particles of graphite, graphite oxide, or a non-graphite laminar compound in a liquid medium containing therein a surfactant or dispersing agent to obtain a stable suspension or slurry; and (b) exposing the suspension or slurry to ultrasonic waves at an energy level for a sufficient length of time to produce separated nano-scaled platelets); and in U.S. Patent Publication No. 2009/0200707 (Kivioja et al., "METHOD OF FABRICATING GRAPHENE STRUCTURES ON SUBSTRATES," discussing a method of fabricating graphene that involves stamping or pressing a body of graphite against a substrate), all of which are hereby incorporated by reference.

In many cases, the nanostructures are more conductive than the surrounding material in the absorption layer 104. The nanostructures can advantageously have a band gap less than that of the material forming the bulk absorption layer 104 and preferably a vanishing band gap. For example, the nanostructures can have a band gap of 0.1 eV or lower, and preferably 0.01 eV or lower. The band gaps of some single-wall carbon nanotubes have been measured to be about 0.6 eV, and the band gaps ($E_g$) of some multi-wall carbon nanotubes can be calculated using $E_g=0.6/d$ where d is the outer diameter of the multi-wall carbon nanotube in nanometers, as is known in the art.

In some embodiments, it can be advantageous for the carbon nanotubes 122 or other nanostructures to be formed of a material having an index of refraction less than that of the material forming the bulk of the absorption layer 104. Light traveling through the absorption layer 104 can be internally reflected within the semiconductor material 112 at the interfaces between the carbon nanotubes 122 and the semiconductor material 112, increasing the opportunity for photons to be absorbed by the layer 104 and to generate electron-hole pairs. For example, the index of refraction for some carbon nanotubes has been measured to be about 2, while the index of refraction of CdSe has been measured to be about 2.6.

In one embodiment of a method for fabricating the above-described photovoltaic device 100, carbon nanotubes can be deposited onto an electrical contact 102 and/or substrate 101. As previously mentioned, the back electrical contact 102 and/or substrate 101 can be roughened or textured, which can be accomplished, for example, via mechanical abrasion or chemical etching. The carbon nanotubes 102 can be deposited via any of a variety of suitable techniques, such as a Langmuir-Blodgett process, spin coating, inkjet printing, or spraying. The density of the carbon nanotubes 122 can be controlled by adjusting the amount deposited in an area. In other embodiments, buckypaper or other commercially available nanotube sheets or films (e.g, pre-formed) can be used. Such sheets are available, for example, from Nanocomp Technologies, of Concord, N.H., USA. To create an absorption layer 104, the semiconductor material 112, such as CdSe, can be grown on the carbon nanotubes 122 using a chemical bath deposition (CBD) technique. Typically, a CBD reaction involves preparing aqueous or non-aqueous solutions containing appropriate precursor compounds (for example, Cadmium precursor solution and Selenium precursor solution) and appropriate ligands. Aliquots of these solutions can be combined in a CBD container, and the object (e.g., carbon nanostructure, wafer, or otherwise) onto which the film will be deposited can be immersed in the resulting chemical bath. The object remains immersed for the time required to form a film of the desired thickness. After removal, the object(s) are rinsed to remove excess reactants and dried for use. It should be understood that the foregoing is a general description and by way of illustration only. CBD processes are described in more detail in U.S. Pat. No. 7,253,014 (Barron et al., "Fabrication Of Light Emitting Film Coated Fullerenes And Their Application For In-Vivo Light Emission"), and in U.S. Patent Publication No. 2005/0089684 (Barron et al., "Coated Fullerenes, Composites And Dielectrics Made Therefrom"), both of which are hereby incorporated by reference in their entirety.

The thickness of the semiconductor coating on the carbon nanotubes 122 can be grown so as to fill in the interstices between carbon nanotubes 122 in the mesh 124, and can be built up above the mesh 124, e.g., to cover the carbon nanotubes 122 and to form a uniform surface for a planar junction 130, as shown in FIG. 1.

The CBD process can provide a crystalline semiconductor coating (including a CdSe crystalline coating having a hexagonal phase) on the carbon nanotubes 122. For example, the crystalline coating can be a single crystal and/or have crystalline regions formed therein. In some cases, the carbon nanotubes 122 can promote the growth of crystalline regions in the semiconductor material 112, for example by nucleating growth of the semiconductor material 112 on the carbon nanotube surfaces. As previously mentioned, the crystalline regions can have advantageous electrical properties, e.g., they can promote high-efficient current generation and collection in the absorption layer 104. In some embodiments, the deposited semiconductor material 112 can be annealed to facilitate the production of a coating of crystalline material. By way of example, such annealing can be performed at an elevated temperature (e.g., in a range of about 300-1000 degrees Celsius) and for a suitable duration (e.g., a few second to a few hours).

In some embodiments, the window layer 106 can be deposited on the absorption layer 104 via CBD (e.g., via another bath deposition again using CBD techniques). The top electrical contact 108 can be fused into place with another CBD bath or deposited directly with CBD.

The foregoing is by way of example only, and a range of variations are possible and are intended to be within the scope of this disclosure. For example, the carbon nanotubes 122 can be coated with the semiconductor material 112 (to act, for example, as a seed layer) before being deposited onto the back electrical contact 102/substrate 101. In such an embodiment, another CBD bath can be performed after the carbon nanotubes 122 are deposited to increase the thickness of the coating of the semiconductor material 112. Further, in other embodiments, other processes for depositing the semiconductor materials and/or other layers of the photovoltaic device can be used, including chemical vapor deposition, molecular beam epitaxy, atomic layer deposition, and electrochemical deposition.

A variety of other embodiments of photovoltaic devices and methods are presented below; however it should be understood that any of them can employ any of the features already described in connection with FIGS. 1-2 (including, for example, the materials, fabrication processes, dimensions, and so on), as they are intended to build on the foregoing discussion.

Figure 3:
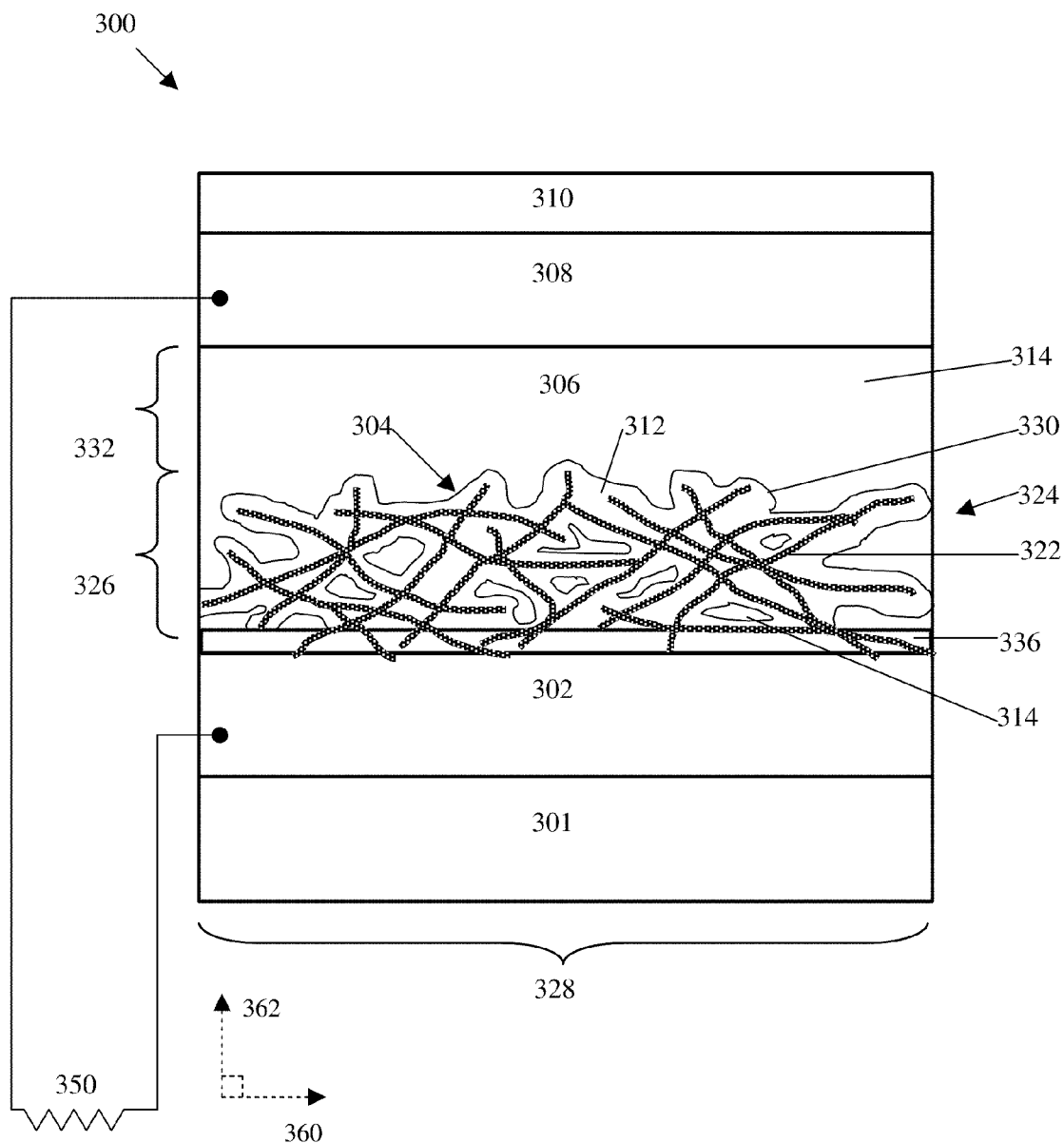
FIG. 3 is a schematic view of another exemplary photovoltaic device which includes a window layer and an absorption layer with a mesh of carbon nanostructures embedded therein, the window layer and the absorption layer forming a distributed junction.

FIG. 3 illustrates another embodiment of a photovoltaic device 300. In this embodiment, the photovoltaic device 300 has an absorption layer 304 that includes a light-responsive material (here, semiconductor material 312) conformally coating a mesh 324 of carbon nanotubes 322. A window layer 306, which can be made of semiconductor material 314 and as previously mentioned can also be light-responsive, is disposed on the absorption layer 304 to form a junctions 330 at the interfaces of the two layers. Although here the window layer 306 has been built up to a uniform surface, it need not be so (for example, alternatively the front electrical contact 308 can be a transparent conductor (e.g., a doped metal oxide) deposited on the window layer 306 and built up to a uniform level). The mesh 324 shown in FIG. 3 extends out of the absorption layer 304 and through an insulating layer 336 to an electrical contact 302, which is disposed on a substrate 301. The insulating layer 336, which can be made for example of silicon dioxide, can be provided between the back electrical contact 302 and the absorption layer 304 to prevent a short circuit path around the junction 330. In addition, a top electrical contact 308 and an anti-reflective coating 310 can be disposed on top of the window layer 306. These and other aspects of the photovoltaic device 300 can be as described in connection with the photovoltaic devices of previous Figures.

The photovoltaic device 300 shown in FIG. 3 can be fabricated using the techniques described above in connection with FIG. 1, with some adjustments. For example, instead of building up the absorption layer 104 by filling in the interstitial spaces between the coated carbon nanotubes to form a planar junction 130, the CBD process can be used (for example, by controlling bath concentrations and immersion times used with the CBD bath) to create a conformal coating on the carbon nanotubes 322 that does not necessarily fill up the interstitial spaces. In some cases, the thickness of the semiconductor coating can be in a range of about 10 nm to 1000 nm. The window layer 306 can be deposited onto the absorption layer 304 via CBD.

Figure 4:
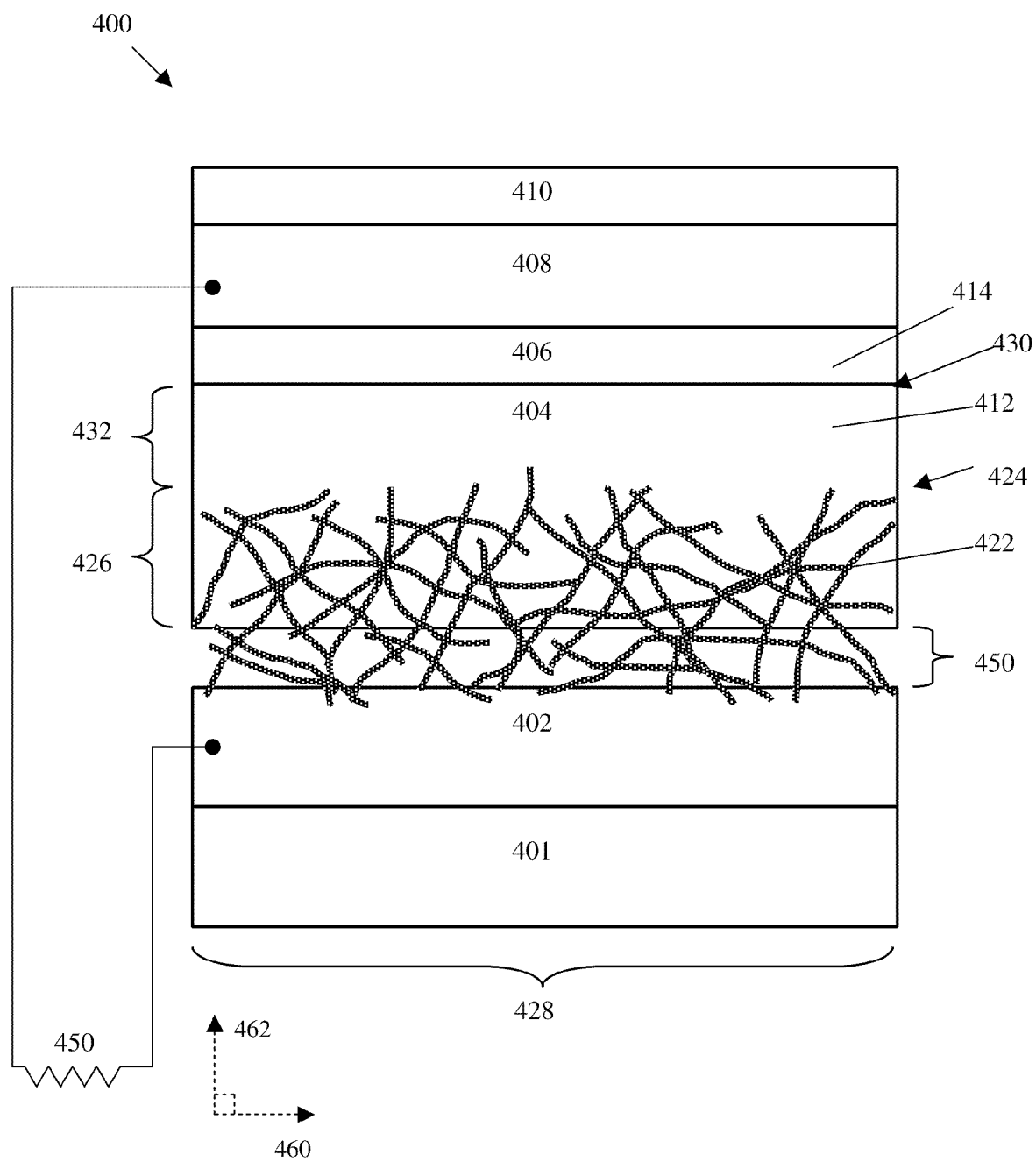
FIG. 4 is a schematic view of another exemplary photovoltaic device which includes a window layer and an absorption layer with a mesh of carbon nanostructures embedded therein, the mesh extending across a gap to an electrical contact.

FIG. 4 illustrates another embodiment of a photovoltaic device 400 that includes a substrate 401, a back electrical contact 402, an absorption layer 404, a window layer 406, a top contact 408, and an anti-reflective coating 410. In this embodiment, the absorption layer 404 and the back electrical contact 402 are separated by a gap 450. As shown, the gap 450 is open, although in some embodiments it can be filled with a material (e.g., an insulating material). The mesh 424 of carbon nanotubes 422 can extend out of the absorption layer 404 to the back electrical contact 402 to form a contact (e.g., an ohmic contact) therewith. The portion of the mesh 424 that spans the gap 450 can include uncoated carbon nanotubes 422. In some embodiments, the size of the gap 450 (e.g., the size across the gap from the absorption layer 404 to the back electrical contact 402) can be in a range of about 100 nm to 10,000 nm; or more preferably in a range of about 500 nm to 1,000 nm. Other aspects of the photovoltaic device 400 can be as described in connection with the photovoltaic devices of previous Figures. In some embodiments, the photovoltaic device 400 can include two meshes of carbon nanostructures, one of which is at least partially disposed in the absorption layer 404 and the other of which is attached to the back electrical contact 402, the two meshes being electrically connected.

The photovoltaic device 400 shown in FIG. 4 can be fabricated using the techniques described above in connection with FIG. 1, with some adjustments. For example, the CBD process can be used to partially coat the carbon nanotubes 422 with a semiconductor material 412. These partially coated nanotubes can be deposited on the back electrical contact 402 to create a mesh 424, leaving the portion of the mesh 424 closest to the back electrical contact 402 substantially uncoated. The absorption layer 404 can be formed by filling in the interstitial spaces of the mesh 424. In some embodiments, the mesh 424 of carbon nanotubes 422 can be coated with a semiconductor material 412 (e.g., via CBD or other process), and then etched on the bottom surface to remove some of the deposited material. The partially coated nanotubes 122 can then be disposed on the back electrical contact 402.

Figure 5:
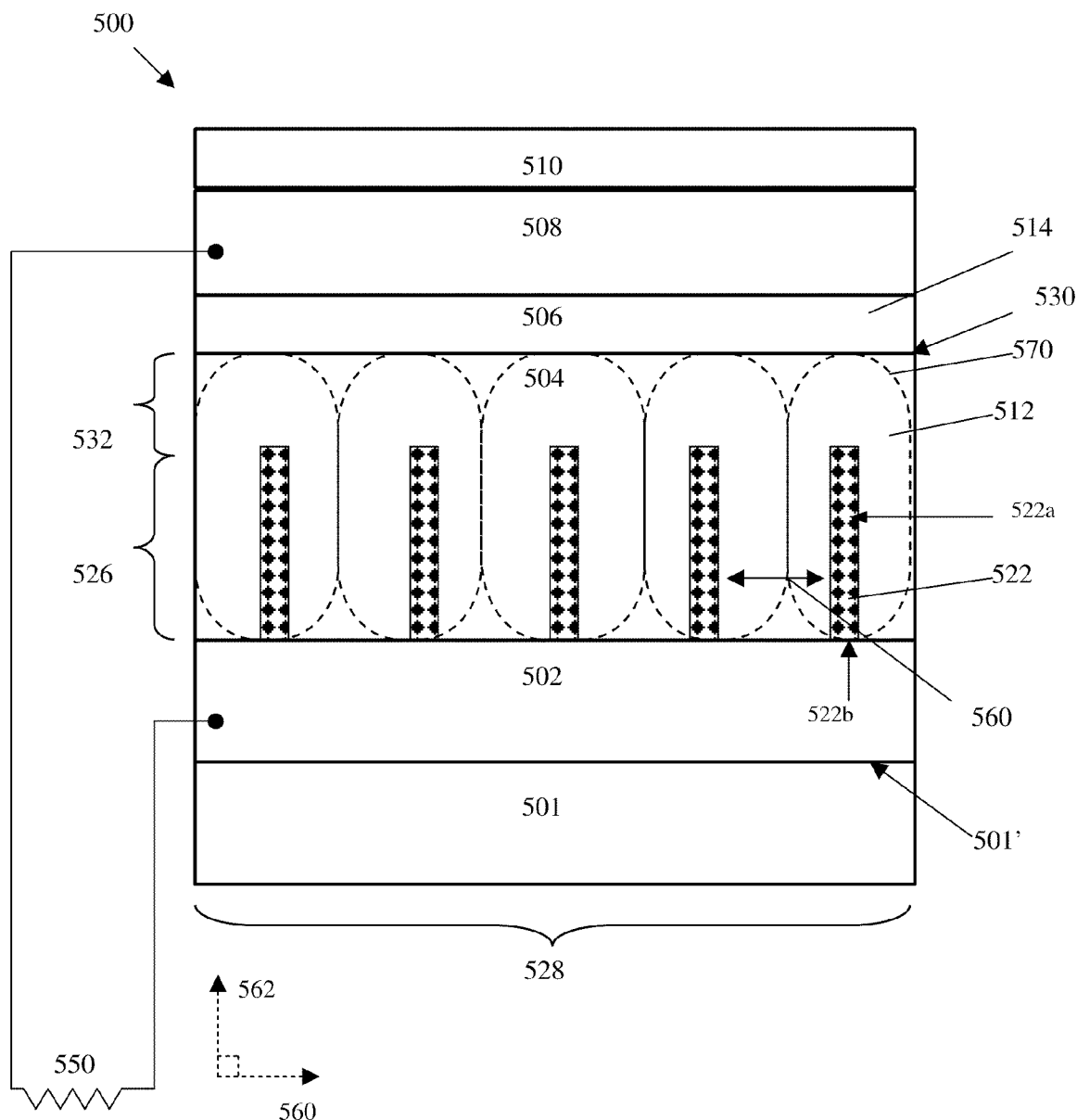
FIG. 5 is a schematic view of an exemplary photovoltaic device which includes a window layer and a plurality of substantially vertically oriented carbon nanostructures located in an absorption layer, the window layer and the absorption layer forming a junction.

Although the foregoing embodiments have illustrated a mesh of carbon nanotubes, a variety of other configurations are possible. FIG. 5 shows an exemplary photovoltaic device 500 with an absorption layer 504 that includes a "carpet" of aligned nanostructures, e.g., substantially vertically oriented nanostructures, which in this embodiment are carbon nanotubes 522. As used herein, substantially vertically oriented means that the nanotubes are nearly, but not exactly, normal to the substrate 501. In many embodiments, the nanotubes can be substantially vertically oriented such that the angle between the nanostructure (e.g., along its height 526) and a vector 562 that is normal to the substrate surface 501' is less than about 45 degrees. In some cases, the orientation of the embedded carbon nanotubes 522 can be such that the majority of nanotubes extend farther in a direction substantially normal to the surface 501' of the substrate 501 (a vertical direction 562 in FIG. 5) that is greater than they extend in a direction substantially parallel to the surface 501' of the substrate 501 (a horizontal direction 560 in FIG. 5), although this is not necessary. In some cases, the carbon nanotubes 522 are upstanding (e.g., the carbon nanotubes can have a sidewall 522a and an end cap 522b, and they can be substantially supported on the substrate by the end cap 522b).

The carpet of carbon nanotubes 522 can be arranged in a wide variety of ways. In FIG. 5, the carbon nanotubes 522 are spaced at substantially regular intervals from one another. However, in other embodiments, the spacing need not be regular. Further, the carbon nanotubes 522 can be placed in bunches, such bunches being spaced apart from one another. As previously mentioned, it can be advantageous to arrange the spacing 580 between adjacent carbon nanotubes 522 to be less than about three diffusion lengths exhibited by photo-generated minority charge carriers (e.g., upon photo-excitation) in the semiconductor material 512 incorporated therebetween, and more preferably less than about two diffusion lengths. It should be understood that while FIG. 5 is a two-dimensional illustration, in a three-dimensional device the interstitial spacing 580 can represent the distance across three-dimensional voids separating carbon nanotubes 522.

The carbon nanotubes 522 can have virtually any size, but preferably they do not extend into the junction 530. For example, the carbon nanotubes 522 can have a height of about 200 nm to 5000 nm and can be embedded in an absorption layer 504 that is about 3 diffusion lengths thicker than the nanotubes are tall (for example, the nanotubes can be about 500 nm) in a region about 1000 nm thick, leaving a region 532 devoid of about 500 nm devoid of nanostructures. However, all such dimensions are merely by way of illustration and can vary widely.

As shown, a semiconductor material 512 which forms the bulk of the absorption layer 504 conformally coats the individual carbon nanotubes 522, filling in the spaces in between them and embedding them in the absorption layer 504. The material 512 can have crystalline regions 570 therein, which can be as previously described. A window layer 506 can be disposed over the absorption layer 504 and can be made of a semiconductor material 514, with the interface of the absorption layer 504 and window layer 506 creating a junction 530 with a depletion region.

The photovoltaic device 500 can also include a substrate 501, a back electrical contact 502, a top electrical contact 508, and an anti-reflective coating 510. These and other aspects of the photovoltaic device 500 can be as described in connection with the photovoltaic devices of previous Figures.

Operation of the photovoltaic device 500 with upstanding carbon nanotubes 522 can be similar to that of the photovoltaic device 100 in many respects. Photons incident on the photovoltaic device 500 can generate electron-hole pairs in the absorption layer 504 and/or in the window layer 506. As previously mentioned, and for explanatory purposes only, the absorption layer 504 can be made of an n-type semiconductor (e.g., CdSe), while the window layer can be made of a p-type semiconductor (e.g., doped CdS). In such an embodiment, the electric field in the junction 530 causes the separation of such electron-hole pairs in the vicinity thereof. Such electrons can travel across the junction 530 to the n-type semiconductor and the holes can travel across the junction 530 to the p-type semiconductor. Additionally, electron-hole pairs are photo-generated outside the vicinity of the depletion region in both the absorption layer 504 and window layer 506. Such electrons and holes can move (e.g., diffuse) within the absorption layer 504 and window layer 506.

Whether generated inside or outside the vicinity of the junction 530, photogenerated electrons can migrate through the n-type absorption layer 504 to the carbon nanotubes 522, which can provide a conductive pathway out of the absorption layer 504 to the back electrical contact 502, although in this embodiment electrons can also pass directly from the absorption layer 504 to the back electrical contact 502. Photogenerated holes can migrate through the p-type window layer 506 to the top electrical contact 508. The electrons in the back electrical contact 502 can travel through an external load 550 to the p-type window layer 506 to recombine with the holes that have migrated through the window layer 506.

The photovoltaic device 500 can be fabricated using the techniques described above in connection with the photovoltaic device 100, with some adjustments. For example, the CBD process can be used to coat aligned (e.g., vertically aligned) carbon nanotubes 722 rather than the mesh 124 described in conjunction with photovoltaic device 100. The fabrication of aligned carbon nanotubes is known in the art through a variety of techniques. For example, aligned nanotubes can be grown chemical vapor deposition (CVD), such as plasma-enhanced hot filament chemical vapor deposition using acetylene as a carbon source and ammonia as a dilution and catalytic agent, as described in Huang et al., "Growth of highly oriented carbon nanotubes by plasma-enhanced hot filament chemical vapor deposition," Applied Physics Letters, Vol. 73 No. 26, 3845 (1998), and Ren et al., "Synthesis of Large Arrays of Well-Aligned Carbon Nanotubes on Glass," Science 282, 1105 (1998), which are hereby incorporated by reference. Aligned nanotubes have been grown using CVD techniques on patterned silicon substrates using Fe/Mo nanoparticles as catalysts and CO and $H_2$ as feed gases. Such techniques are described in Huang et al., "Growth Mechanism of Oriented Long Single Walled Carbon Nanotubes Using 'Fast-Heating' Chemical Vapor Deposition Process," Nano Letters, Vol. 4, No. 6, 1025-1028 (2004), which is hereby incorporated by reference. Other alignment techniques include the use magnetic fields, mechanical shear, and gel extrusion, as discussed in Fischer et al., "Magnetically aligned single wall carbon nanotubes films: Preferred orientation and anisotropic properties," Journal of Applied Physics, Vol. 93 No. 4, 2157 (2003), which is hereby incorporated by reference. Inkjet printing can be used in some circumstances. Further, arrays of carbon nanotubes can be commercially obtained from suppliers, as previously mentioned. More details on the formation and alignment of carbon nanotubes can be obtained with reference to U.S. Patent Publication Nos. 2005/0260120 (Smalley et al., "Method For Forming An Array Of Single-Wall Carbon Nanotubes In An Electric Field And Compositions Thereof") and 2005/0249656 (Smalley et al, "Method For Forming A Patterned Array Of Single-Wall Carbon Nanotubes").

Figure 6:
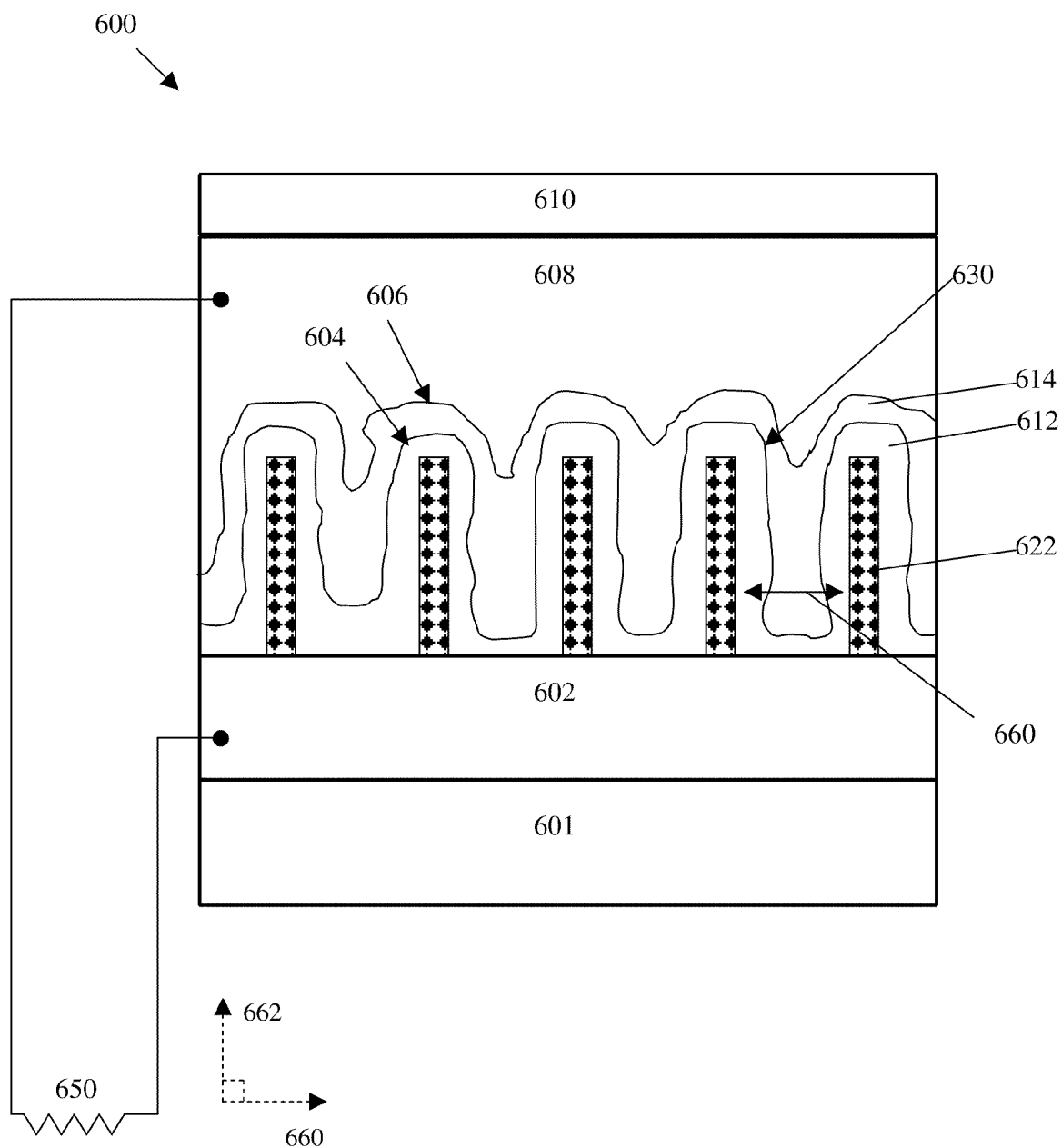
FIG. 6 is a schematic view of another exemplary photovoltaic device which includes a window layer and a plurality of substantially vertically oriented carbon nanostructures located in an absorption layer, the window layer and the absorption layer forming a non-planar junction.

In FIG. 5, the semiconductor material 512 has been built up to cover the tops of the carbon nanotubes 522 and create a substantially planar junction 522. However, the semiconductor material 512 (relative to that shown in FIG. 5) need not be so thick. FIG. 6 illustrates such an alternate embodiment. FIG. 6 shows a photovoltaic device 600 which has semiconductor material 612 conformally coating individual carbon nanotubes 622 in a carpet of substantially vertically oriented carbon nanotubes 622. A window layer 606, which is made of semiconductor material 614, is disposed on the absorption layer 604 to form a non-planar junction 630. The carbon nanotubes extend to an electrical contact 602, which is disposed on substrate 601. In addition, a top electrical contact 608 and an anti-reflective coating 610 can be disposed on top of the window layer 606. These and other aspects of the photovoltaic device 600 can be as described in connection with the photovoltaic devices of previous Figures.

Figure 7:
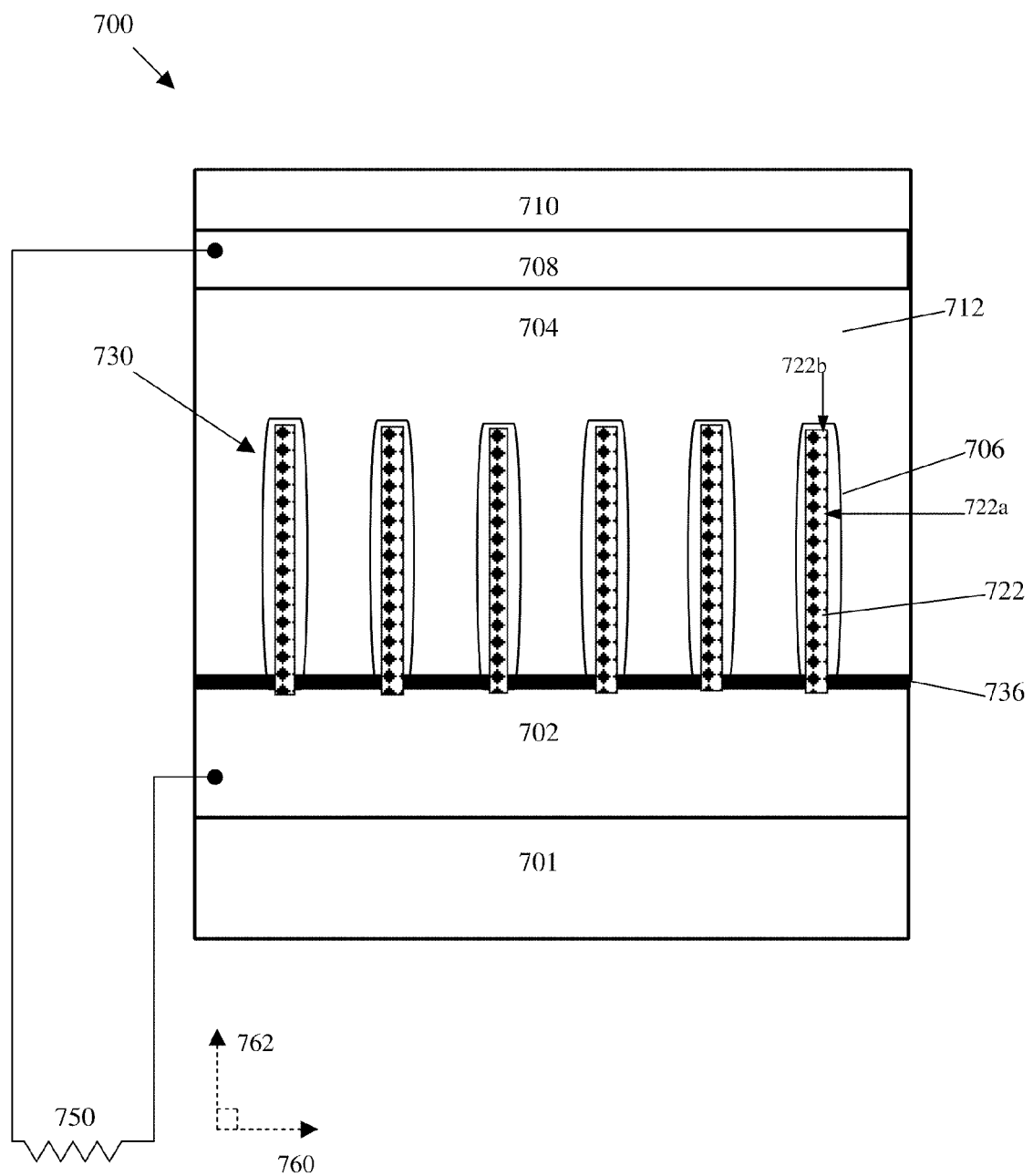
FIG. 7 is a schematic view of an exemplary photovoltaic device which includes a plurality of coated carbon nanostructures embedded in an absorption layer.

FIG. 7 illustrates another exemplary photovoltaic device 700 which includes a light-responsive absorption layer 704 made of a semiconductor material 712 in which are embedded nanostructures (in this case carbon nanotubes 722) that are conformally coated with a film made of a semiconductor material. The absorption layer 704 and the coating 706 can be doped to have differing conductivity types (e.g., n-type and p-type) so as to form a junction 730 at the interface of the coating of each carbon nanotubes 722 and the semiconductor material 712 with a depletion region. In this manner, the carbon nanotubes 722 extend through a porous insulating layer 736, such as a silica layer, which separates the absorption layer 704 from the back contact 702 and substrate 701. A top electrical contact 708 can be provided above the absorption layer 704, and an anti-reflective-layer 710 can be provided above the top electrical contact 708. These and other aspects of the photovoltaic device 700 can be as described in connection with the photovoltaic devices of previous Figures.

In use, photons incident on the photovoltaic device 700 can generate electron-hole pairs in the semiconductor material 712 of the absorption layer 704 and in the semiconductor material of the coating 706. For explanatory purposes only, the absorption layer 704 can be made of an n-type semiconductor, while the coating 706 can be made of a p-type semiconductor. In such an embodiment, the electric field in the junction 730 causes the migration of holes through the p-type coating 706 to carbon nanotubes 722, which in turn provide an electrically conductive path to the back electrical contact 702. The electric field also causes the migration of electrons through the n-type absorption layer 704 to the top electrical contact 708. The electrons travel through an external load 750, through the back electrical contact 702 and the carbon nanotubes 722, and recombine with the holes in the p-type coating 706.

The photovoltaic device 700 can be fabricated using the techniques described above in connection with the photovoltaic device 100, with some adjustments. For example, the coating 706 (e.g., semiconductor 714, such as p-type CdTe) can be grown on each individual carbon nanotube 722 (e.g., the carbon nanotubes can have a sidewall 722a and an end cap 722b, and both sidewall 722a and endcap 722b can be coated), followed by a deposition of a seed layer of semiconductor material 712 (e.g., n-type CdSe). The coated carbon nanotubes 722 can then be deposited on the back electrical contact 702, e.g., in a manner previously described. The absorption layer 704 can be grown over the carbon nanotubes 722 (e.g., building up the thickness of semiconductor material 712) and the top electrical contact 708 can be fused thereon.

Other nanostructures can be incorporated into the exemplary photovoltaic devices disclosed herein, including in particular semiconductor nanostructures. Such nanostructures may exhibit quantum effects, e.g., acting as quantum dots, or may be substantially free of quantum confinement effects.

Figure 8A:
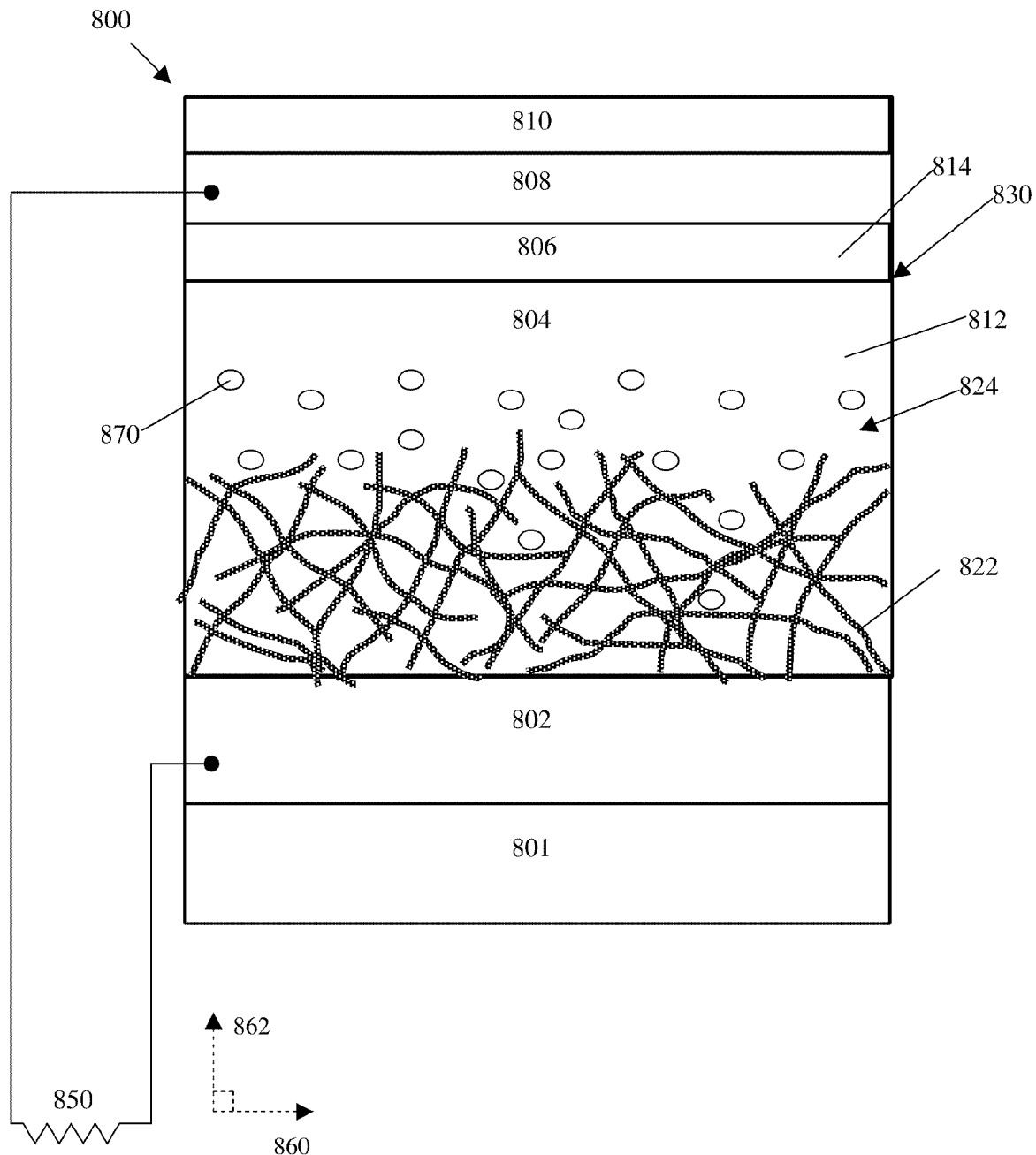
FIG. 8A is a schematic view of an exemplary photovoltaic device which includes a window layer and an absorption layer with a mesh of carbon nanostructures and a plurality of composite nanostructures embedded therein.

FIG. 8A schematically depicts an exemplary photovoltaic device 800 accordingly to another embodiment of the invention that includes absorption layer 804 and window layer 806, which can be semiconductor light responsive layers, as previously described. As shown, the absorption layer 804 and window layer 806 are in contact with one another along a planar junction 830. By way of illustration, in this embodiment, the absorption layer 804 can be made of a semiconductor material 812 doped to be n-type while the window layer 806 can be made of a semiconductor material 814 doped to be p-type. In other embodiments, the n- and p-type doping of the layers can be reversed.

A plurality of carbon nanostructures 822 (e.g., in this case, carbon nanotubes, which can be single-wall or multi-wall tubes) forming a mesh 824 are distributed within the absorption layer 804. As previously described, however, a portion of the absorption layer 804 in the vicinity of the junction 830 can remain substantially free of such carbon nanostructures 822 to ensure that the carbon nanostructures 822 do not provide a conductive path across the junction 830.

In this embodiment, the absorption and window layers 804, 806 are sandwiched between two electrically conductive layers (shown as back electrical contact 802 and top electrical contact 808) such that the absorption layer 804 forms a contact (e.g., ohmic contact) with the back electrical contact 802 and the window layer 806 forms a contact (e.g., ohmic contact) with the top electrical contact 808. The mesh 824 of carbon nano structures is also in contact (e.g., ohmic contact) with the back electrical contact 802 to provide an electrically conductive path out of the absorption layer 804 thereto. The layer 810 can be formed of an antireflective and transparent material to allow the passage of photons incident thereon to the absorption and window layers 804, 806.

With continued reference to FIG. 8A, a plurality of composite nanostructures 870 are disposed over (and in some cases, in between) the mesh 824 of carbon nanostructures 822 so as to be in electrical contact therewith. In this embodiment, the composite nanostructures 870 include a core formed primarily of carbon and a shell formed of a semiconductor material. The semiconductor shell of the composite nanostructures 870 can have the same conductivity type as that of the material 812 forming the bulk of the absorption layer 804 (e.g., both can include n-type doping, such as n-type/n-type or n+-type/n-type) to prevent the formation of a depletion region at the interface of the semiconductor shells and the material 812.

Figure 8B:
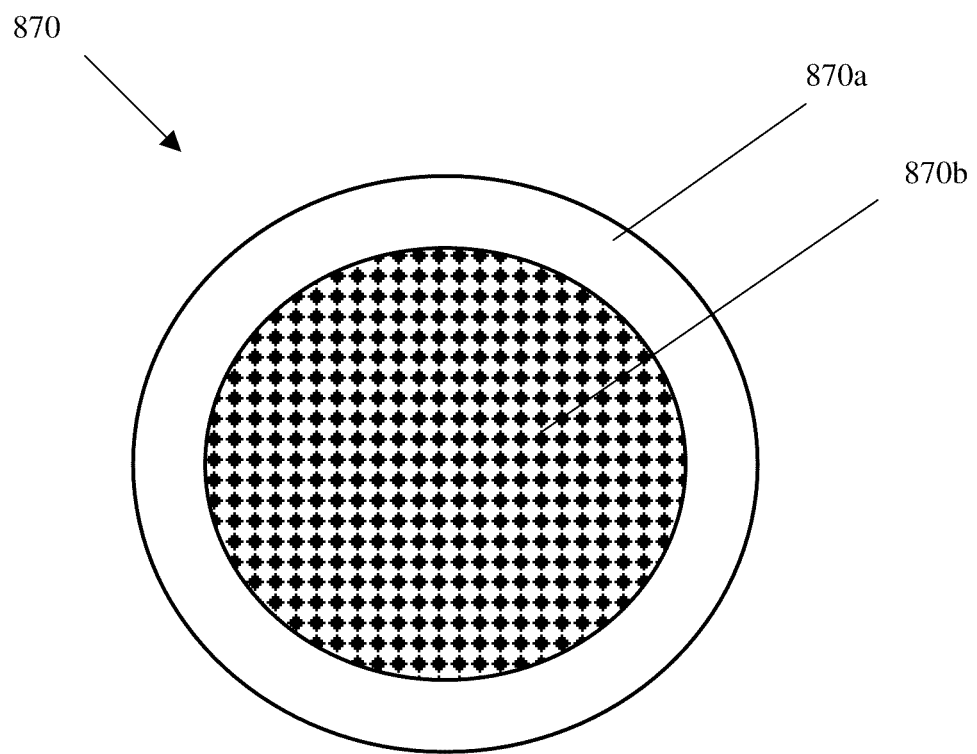
FIG. 8B is a schematic view of an exemplary composite nanostructure having a core made of a carbon nanostructure and a shell made of a semiconductor material.

By way of illustration and with reference to FIG. 8B, a composite nanostructure 870 can include a core 870b formed of a carbon nanostructure and a semiconductor shell 870a. By way of example, the composite nanostructures 870 can be in the form of substantially spherical particles having a carbon core with a diameter, e.g., in a range of about 0.7 nm to about 100 nm, and a semiconductor shell 870a. In many embodiments, the thickness of the semiconductor shell 870a is selected such that the optical properties of the shell 870a (e.g., its band gap) are not dominated by quantum confinement effects. By way of example, the semiconductor shell 870a can have a thickness in a range of about 1 nm to about 100 nm, or in a range of about 1 nm to about 50 nm, or in a range of about 1 nm to about 30 nm, or in a range of about 1 nm to about 20 nm, or in a range of about 1 nm to about 10 nm. In other embodiments, the semiconductor shells 870a of the nanocomposite structures 870 can provide quantum confinement (e.g., they can function as quantum dots). The semiconductor material of the shell 870a can advantageously be crystalline.

By way of example, in this embodiment, the core 870b can be formed of $C_{60}$ molecules, $C_{72}$ molecules, $C_{84}$ molecules, $C_{96}$ molecules, $C_{108}$ molecules, or $C_{120}$ molecules, which are herein referred to as buckyballs, while in other embodiments the core 870b can be formed of a carbon nanotube (e.g., a single-wall or multi-wall nanotube). The semiconductor shell 870a can in turn be formed of any suitable semiconductor material, such as Group II-VI semiconductor materials. Although in this embodiment the semiconductor shell 870a is shown as completely coating the core 870b, in other embodiments the shell 870a can partially coat the core 870b such that a portion of the core remains exposed. In some cases, the uncoated portions of such partially coated cores can be in electrical contact with the carbon nanostructures 822 of the mesh 824 to facilitate the transfer of charge carriers generated in the semiconductor shell 870b (e.g., in response to absorption of a photon) to the mesh 824.

In many embodiments, the semiconductor shells can be formed of a semiconductor material having a smaller band gap that that of the material forming the bulk of the absorption layer 804 so as to enhance the absorption of photons passing through that layer. It should also be understood that the composite nanostructures 870 can be replaced by nanostructures without a composite structure (e.g., a nanostructure formed of a semiconductor material without a carbon core), which can also be formed of a semiconductor material having a smaller band gap that that of the material forming the bulk of the absorption layer 804.

In use, the conductive layer 808 can be exposed to solar radiation that passes through that layer 808 without any substantial absorption to reach the window layer 806. Some of the photons passing through the window layer 806 can be absorbed by the material 814 of that layer to generate electron-hole pairs. Other incident photons pass through that layer 806 to be absorbed by the material 812 of the absorption layer 804 so as to generate electron-hole pairs therein. In some embodiments, the band gap of the material 814 forming the layer 806 is greater than the band gap of the material 812 forming the bulk of the absorption layer 804. Further, as noted above, the band gap of the semiconductor material forming the shells 870b of the composite nanostructures 870 can be less than that of the material 812 forming the bulk of the absorption layer 804. Such "cascading" of the band gaps can advantageously enhance the absorption of photons by the photovoltaic cell 800 as the layer 804 can absorb, in addition to high energy photons, some of the lower energy photons to which layer 806 is transparent due to its larger band gap. Likewise, the semiconductor shells 870b can absorb some of the photons having energies less than that corresponding to the band gap of the material 812 forming the bulk of the layer 804, although the shells 870b may also absorb high energy photons that were not absorbed (e.g., by the materials 812, 814 in the layers 804, 806) before reaching the composite nanostructures 870.

The carbon nanostructures 822 can also produce light-trapping effects (e.g., by providing an index of refraction less than that of the material 812 in the bulk of the layer 804 so as to cause internal reflection therein), as described previously.

The absorbed photons can generate electron-hole pairs. As previously described in connection with other embodiments, in the context of an n-type material 812 and p-type material 814, electrons can migrate to the back electrical contact 802 via the carbon nanostructures 822 (or directly). Holes can migrate to the front electrical contact 808. Electrons can pass through the load 850 and arrive at the front electrical contact 808 and the window layer 806 to recombine with the holes that have migrated within that layer.

The photovoltaic device 800 shown in FIG. 8A can be fabricated using the techniques described above in connection with FIG. 1, with some adjustments. In some embodiments, the composite nanostructures 870 can be fabricated by initially forming the carbon nanostructure cores 870b via any of a number of fabrication techniques known in the art, as previously mentioned. In some embodiments, the carbon cores 870b can then be coated with a semiconductor shell 870a by utilizing CBD techniques, such as those previously discussed. The thickness of the semiconductor shell 870a can be adjusted by allowing the chemical bath deposition to proceed for a selected time period. Alternatively, other techniques, such as atomic layer deposition, molecular beam epitaxy, or chemical vapor deposition, can be utilized to coat carbon cores with a semiconductor shell.

The use of a carbon core 870b as a "scaffolding" for the formation of the semiconductor shell 870a can provide certain advantages. For example, it can allow for the generation of a plurality of nanoparticles whose sizes are narrowly distributed. More specifically, it can facilitate the formation of a semiconductor shell with a desired nanosized thickness, and consequently a desired band gap. For example, the use of bucky balls as the carbon cores allows the formation of a plurality of substantially spherical nanoparticles with a carbon core and semiconductor shell having diameters within a narrow distribution about an average diameter. The ability to generate the composite nanostructures 870 with substantially uniform sizes allows the nanoparticles to have substantially similar band gaps, e.g., in the above embodiment of FIG. 8A the band gap value less than that of the bulk of the absorption layer 804.

As noted above, a variety of semiconductor materials can be utilized to form the semiconductor shell 870a, including any of the materials 812, 814 used in the absorption layers 804 and window layer 806, as detailed above in connection with FIG. 1. By way of example, in one embodiment the bulk of the absorption layer 804 is formed of CdS (e.g., with n-type or p-type doping), the window layer 806 is formed of ZnO, and the semiconductor shells 870a of the composite nanostructures 870 are formed, e.g., of CdSe or CdTe, having the same conductivity type as that of the bulk of the absorption layer 804.

Although FIG. 8A illustrates the incorporation of nanostructures 870 into a photovoltaic device which has a mesh 824 of carbon nanostructures 822, in other embodiments, semiconductor nanostructures can be similarly incorporated into photovoltaic devices with upstanding carbon nanostructures, such as the photovoltaic device shown in FIG. 5.

Figure 9:
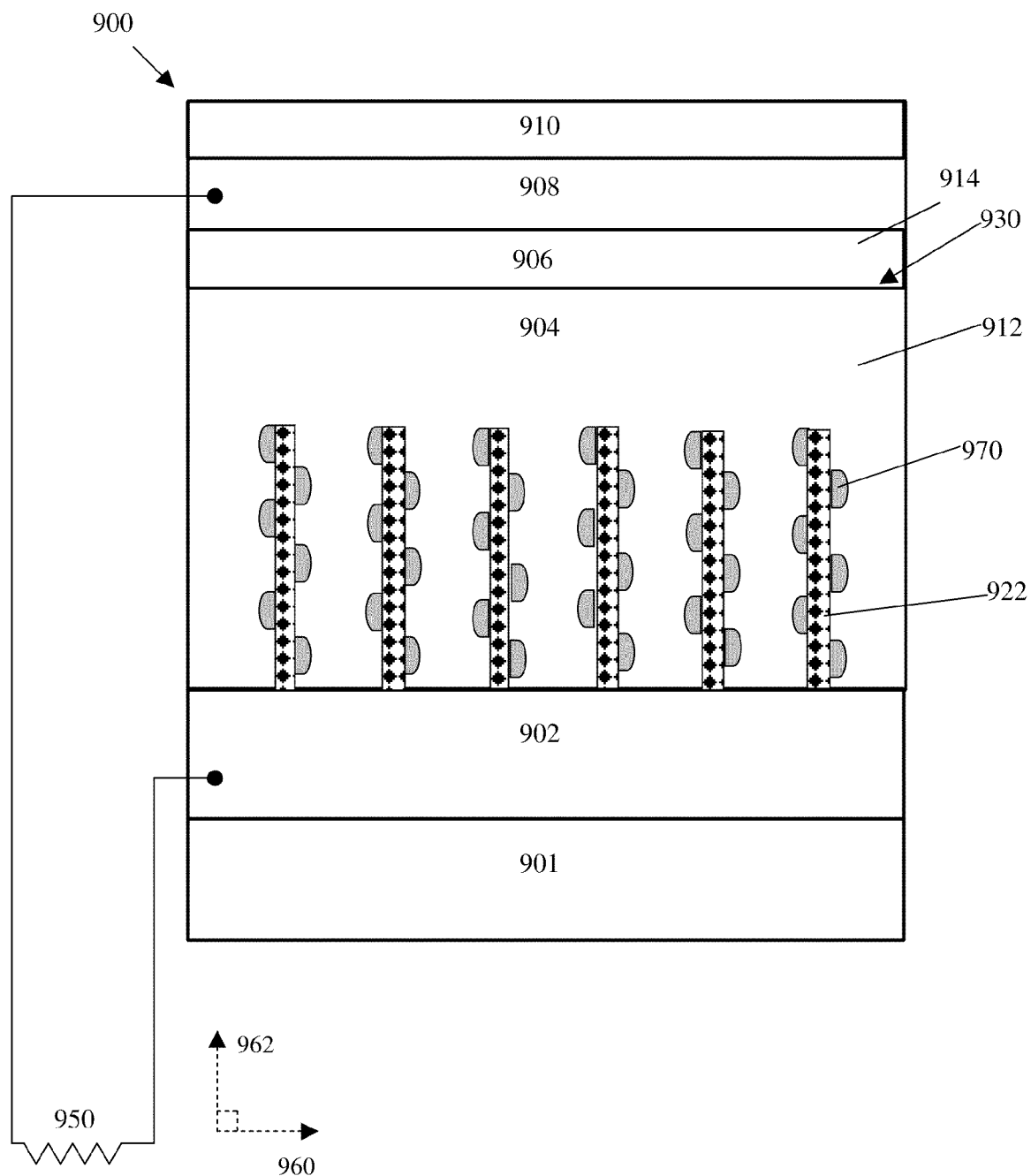
FIG. 9 is a schematic view of an exemplary photovoltaic device which includes a window layer and a plurality of substantially vertically oriented carbon nanostructures embedded in an absorption layer, the carbon nanostructures having semiconductor nanostructures disposed thereon.

FIG. 9 illustrates another exemplary photovoltaic device 900, which has an absorption layer 904 formed from a semiconductor material 912 (e.g., an n-type semiconductor, such as n-type CdSe) and a window layer 906 formed from a semiconductor material 914 (e.g., a p-type semiconductor, such as p-type doped CdS). As shown, the absorption layer 904 and window layer 906 form a junction 930 (e.g., a p-n junction).

A plurality of carbon nanostructures (in this case, carbon nanotubes 922) are embedded in the absorption layer 904. Semiconductor nanostructures 970 can be disposed on portions of the outer surfaces of the carbon nanotubes 922. The semiconductor nanostructures 970 can be made (e.g., entirely or predominantly) of a semiconductor material of similar conductivity type to the semiconductor material 912. By way of illustration, the semiconductor material 912 can be an n-type material and the semiconductor nanostructures 970 can comprise an n- or n+-type material (or alternatively, p-type and p+-type, respectively), or the semiconductor material 912 and the semiconductor nanostructures 970 both can be n-type (or p-type) semiconductor materials. Again, the use of different bandgap materials in the semiconductor nanostructures 970 can be advantageous for tuning the absorption capabilities of the absorption layer 904.

The photovoltaic device 900 can further include a substrate 901, a back electrical contact 902, a top electrical contact 908, and an anti-reflective coating 910. These and other aspects of the photovoltaic device 900 can be as described in connection with the photovoltaic devices of previous Figures.

The photovoltaic device 900 shown in FIG. 9 can be fabricated using the techniques described above in connection photovoltaic device 500 shown in FIG. 5, with some adjustments. For example, the CBD process can be used to grow semiconductor nanostructures 970 onto carbon nanotubes 922 before they are covered with semiconductor material 912. The immersion time of the carbon nanotubes can be limited such that semiconductor nanostructures 970 of desired sizes form (typically growing from nucleation or displacement sites on the carbon nanotube sidewall).

Although FIG. 9 illustrates the incorporation of semiconductor nanostructures 970 into a photovoltaic device with predominantly upstanding carbon nanostructures, in other embodiments, such semiconductor nanostructures 970 can be similarly incorporated into photovoltaic devices having a mesh of carbon nanostructures, such as the photovoltaic device shown in FIG. 1.

Figure 10:
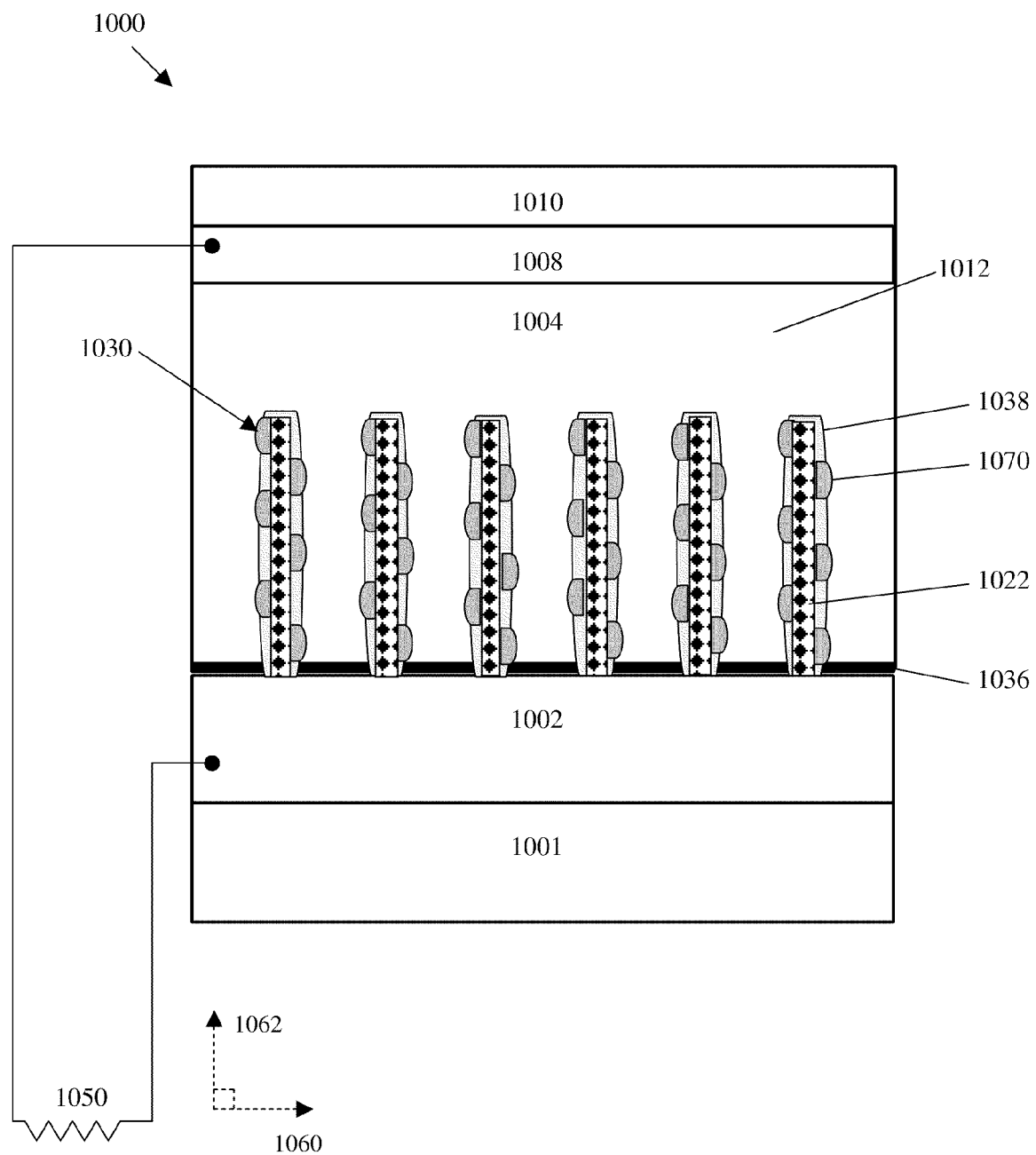
FIG. 10 is a schematic view of an exemplary photovoltaic device which includes an absorption layer with a plurality of substantially vertically oriented carbon nanostructures embedded therein, the carbon nanostructures having semiconductor nanostructures disposed thereon and an insulating layer covering portions of the carbon nanostructures.

FIG. 10 illustrates another exemplary photovoltaic device 1000. In this embodiment, the photovoltaic device 1000 has an absorption layer 1004 formed from a semiconductor material 1012. A plurality of carbon nanostructures (in this case, carbon nanotubes 1022) can be embedded in the absorption layer 1004. Semiconductor nanostructures 1070 can be disposed on portions of the outer surfaces of the carbon nanotubes 922. In this embodiment, the semiconductor nanostructures 1070 are made (e.g., entirely or predominantly) of a semiconductor material doped to be of a different conductivity type than the semiconductor material 1012. By way of illustration, the semiconductor material 1012 can be an n-type material and the semiconductor nanostructures 1070 can comprise an p-type material. The interfaces of the semiconductor material 1014 and the semiconductor nanostructures form a plurality of junctions 1030 (e.g., each being a p-n junction), so that the photovoltaic device 1000 essentially includes a distributed heterojunction.

In this embodiment, portions of the carbon nanotubes 1022 that are between the semiconductor nanostructures 1070 are coated with an insulating material 1038 (e.g., silica). Insulating layer 1036 can be disposed between the absorption layer 1004 and a back electrical contact 1002, with the carbon nanotubes 1022 extending through the insulating layer 1036 to make contact (e.g., ohmic contact) with the back electrical contact 1002.

The photovoltaic device 1000 can further include a substrate 1001, a top electrical contact 1008, and an anti-reflective coating 1010. These and other aspects of the photovoltaic device 1000 can be as described in connection with the photovoltaic devices of previous Figures.

As previously mentioned, and for explanatory purposes only, the absorption layer 1004 can be made of n-type CdSe, while the semiconductor nanostructures 1070 layer can be made of p-type CdTe. In use, photons incident on the photovoltaic device 1000 can generate electron-hole pairs in the semiconductor material 1012 in the absorption layer 1004. They also can produce multi-exciton generation (MEG) in the semiconductor nanostructures 1070. Charge separation occurs across the heterojunction formed between the n-type CdSe absorption layer 1004 and the p-type semiconductor nanostructures 1070 such that holes from the absorption layer 1004 are swept into the semiconductor nanostructures 1070 and electrons resulting from MEG in the semiconductor nanostructures 1070 are swept into the n-type CdSe absorption layer 1004. The photogenerated electrons can pass through an external load 1050 and return via the back electrical contact 1002 and the carbon nanotubes 1022 to combine with holes created in the semiconductor nanostructures 1070.

The photovoltaic device 1000 shown in FIG. 10 can be fabricated using the techniques described above in connection with photovoltaic device 900 shown in FIG. 9, with some adjustments. For example, in one embodiment, the carbon nanotubes 1022 can have semiconductor nanostructures 1070 deposited on them in a CBD bath (e.g., as described in connection with FIG. 9). The semiconductor nanostructures 1070 can be chemically capped, as is known in the art, to prevent deposition of the insulating layer 1038 (e.g., silica) on them. The insulating layer 1038 can be deposited on the exposed surface portions of the carbon nanotubes 1022. The chemical cap can be removed from the semiconductor nanostructures 1070 and the semiconductor material 112 can be grown on the semiconductor nanostructure/carbon nanotube composite structure 1070/1022 (e.g., as a seed coating). The composite structure 1070/1022 can be deposited on the back electrical contact 1002 by suitable techniques (e.g., inkjet printing or spin coating, or other techniques as previously described) and the semiconductor material 1012 can be grown in to fill the volume between the composite structures 1070/1022 to create absorption layer 1004. In other embodiments, the step of depositing the seed coating can be omitted and instead the composite structures 1070/1022 can be deposited and then the semiconductor material 1012 grown to form the absorption layer 1004. The top electrical contact 1008 and other elements can be assembled as previously described.

Although FIG. 10 illustrates the incorporation of semiconductor nanostructures 1070 into a photovoltaic device with upstanding carbon nanostructures, in other embodiments, such semiconductor nanostructures 1070 can be similarly incorporated into photovoltaic devices having a mesh of carbon nanostructures, such as the photovoltaic device shown in FIG. 1.

The photovoltaic devices disclosed herein can efficiently convert light to electrical energy. Without being limited by theory, the nanostructures incorporated into many of the embodiments described above can provide several efficiency-enhancing benefits. In some cases, the nanostructures can provide a conductive pathway out of an absorption layer and thereby reduce recombination of generated electron-hole pairs therein, e.g., by ensuring that a higher proportion of charge carriers are able to escape the absorption layer before recombination. The nanostructures also can provide light trapping structures (e.g., by providing a material with an index of refraction less than that of the material that can make up the bulk of the absorption layer) and thereby can increase the opportunity for light to be absorbed in the absorption layer. Further, the nanostructures can act as nucleation sites for the growth of crystalline materials in the absorption layer. Such crystalline material can provide advantageous electrical properties in the layers. As a result, the photovoltaic devices described herein can convert light to electrical energy with improved efficiencies over existing technologies, e.g., for a given absorption layer thickness.

In some embodiments, the addition of nanostructures to seed the growth of crystalline layers around the nanostructures and promote polycrystalline growth in the bulk of the absorber layer will enhance minority carrier lifetimes and also facilitate electron removal from (or insertion into) the absorber layer to yield a total efficiency for the nanostructured solar cell equal or greater than about 4%, or about 8%, preferably 10% and more preferably 15%, e.g., in a range from about 14% to about 17% (e.g., in a range of about 14.5% to about 16.5%). Moreover, the addition of composite nanostructures having a lower band gap than that of the material forming the bulk of the absorption layer can enhance the absorption of photons. Such enhancement of the photon absorption can reasonably be expected to further improve the device efficiency (e.g., by about 2 to 4 percentage points), to yield an efficiency for the device in the range of about 16% to about 20%.

It should be understood that the foregoing theoretical discussion is illustrative only and that such features and/or efficiencies are not necessary to a photovoltaic device constructed in accordance with the teachings herein.

EXAMPLE

The following procedures, which are illustrative in nature and provided only as non-limiting examples, describe CBD procedures that have been used for depositing semiconductor materials on carbon nanotubes. These procedures can be used for the creation of absorption and window layers and for forming photovoltaic devices such as those described herein. The procedures described in aforementioned U.S. Pat. No. 7,253,014 (Barron et al., "Fabrication Of Light Emitting Film Coated Fullerenes And Their Application For In-Vivo Light Emission"), and in U.S. Patent Publication No. 2005/0089684 (Barron et al., "Coated Fullerenes, Composites And Dielectrics Made Therefrom"), can also be used.

I. Exemplary Procedure for Preparation of Chemical Bath Deposition (CBD) Solution for Deposition of Cadmium Selenide (CdSe) onto Carbon Nanotube (CNT) Substrates A. Preparation of Stock Solutions (10 mL Total Volumes).
  1. 0.1 M Cadmium Sulfate solution: dissolve 0.209 g of Cadmium Sulfate ($CdSO_4$) with de-ionized water (d.i. HO) to a final volume of 10 mL.
  2. 0.8 M Sodium Citrate solution: dissolve 2.32 g of Sodium Citrate Dihydrate ($Na_3C_6H_5O_7.2H_2O$) with d.i. $H_2O$ to a final volume of 10 mL.
  3. 1.5 M Ammonia solution: dilute 1 mL of concentrated Ammonium Hydroxide (NHOH) solution (conc=15 M $NH_3$) with d.i. $H_2O$ to a final volume of 10 mL.
  4. 0.01 M Sodium Sulfite: dissolve 0.013 g of Sodium Sulfite ($Na_2SO_3$) with d.i. $H_2O$ to a final volume of 10 mL. NOTE: This solution was prepared immediately before use.
  5. 0.1 M DMSU solution (stabilized): dissolve 0.151 g of 1,1-Dimethyl-2-Selenourea ($C_3H_8N_2Se$, DMSU) with 0.01 M Sodium Sulfite solution to a final volume of 10 mL. NOTE: This solution was prepared immediately before use.
  6. 0.005 M Mercury (II) Chloride solution: dissolve 0.014 g of Mercury (II) Chloride ($HgCl_2$) with d.i. $H_2O$ to a final volume of 10 mL.

B. Preparation of CBD Solution (10 mL Total Volume, Final pH=9.6-9.7).
  1. Place 1.7 mL of d.i. $H_2O$ in a vial.
  2. Add 3.0 mL of the 0.1 M Cadmium Sulfate solution to the vial.
  3. Add 1.5 mL of the 0.8 M Sodium Citrate solution to the vial.
  4. Add 1.2 mL of the 1.5 M Ammonia solution to the vial.
  5. Add 2.6 mL of the 0.1 M DMSU solution (stabilized) to the vial.

C. Preparation of the Substrate.
  1. CNT substrates can be immersed into enough d.i. $H_2O$ to completely cover their surfaces at a rate that is slow enough to gently displace any trapped air with water.
  2. The substrates are left soaking in water for 10 min or until they are needed for Step D1.
  3. Upon removing the substrates from the water, excess water is allowed to drip from the surface; however, they are not allowed to dry, but are instead dipped into the CBD solution wet (Step D1).

D. Coating of the Substrate.
  1. Immediately after completing Step C3, immerse substrate into the resultant CBD solution within the vial. Leave at room temperature for 12 h. Note: Substrate was oriented vertically or with the side of interest tilted face down to minimize the unwanted deposition of bulk precipitate due to gravity.
  2. After 12 h. have passed, remove the substrate from the CBD solution and rinse it with copious amounts (~50 mL) of d.i. $H_2O$ to remove any reagents and adsorbed precipitate.
  3. Samples are allowed to dry in air at room temperature before characterization.

E. Doping of the Coated Substrates.
  1. Doping of coated-CNT substrates with Hg to enhance the n-type conductivity of the CdSe coating may be accomplished by immersing the substrates after Step D2 into a 0.005 M $HgCl_2$ solution for 15 min at room temperature.
  2. After 15 minutes have passed, remove the substrate from the solution and rinse it with copious amounts (~50 mL) of d.i. $H_2O$ to remove any reagents.
  3. Samples are allowed to dry in air at room temperature before characterization.

F. Thermal Annealing of the Coated Substrates.
  1. Thermal annealing of either doped coated-CNT substrates from Step E3 or undoped coated-CNT substrates from Step D3, for improving the photoconductivity of the CdSe coatings, can be affected by placement in an oven at 300° C. under a normal atmosphere of air for 1 h.
  2. After 1 h. has passed, the samples are removed from the oven and allowed to cool to room temperature before further modification or characterization.

II. Exemplary Procedure for Preparation of Chemical Bath Deposition (CBD) Solution for Deposition of In-Situ Cu-Doped Cadmium Sulfide (CdS) onto CdSe-Coated Carbon Nanotube (CNT) Substrates.

A. Preparation of Stock Solutions (10 mL Total Volumes).
  1. 1.0 M Cadmium Sulfate solution: dissolve 2.09 g of Cadmium Sulfate ($CdSO_4$) with de-ionized water (d.i. $H_2O$) to a final volume of 10 mL.
  2. 15 M Ammonia solution: use concentrated Ammonium Hydroxide ($NH_4OH$) solution (conc=15 M $NH_3$) as purchased.
  3. 1.0 M Thiourea solution: dissolve 0.761 g of Thiourea ($CH_4N_2S$, TU) with de-ionized water (d.i. H2O) to a final volume of 10 mL.
  4. 3.75 M Triethanolamine solution: dissolve 5.59 g Triethanolamine ($C_6H_{15}NO_3$, TEA) with d.i. $H_2O$ to a final volume of 10 mL.
  5. 0.1 M Cupric Chloride solution: dissolve 0.170 g of Cupric Chloride Dihydrate ($CuCl_2.2H_2O$) with de-ionized water (d.i. $H_2O$) to a final volume of 10 mL.

B. Preparation of CBD Solution (10 mL Total Volume).
   1. Place 7.91 mL of d.i. $H_2O$ in a vial.
   2. Add 0.500 mL of the 1.0 M Cadmium Sulfate solution to the vial.
   3. Add 0.467 mL of the 3.75 M Triethanolamine solution to the vial.
   4. Add 0.500 mL of the 15 M Ammonia solution to the vial.
   5. Add 0.120 mL of the 0.1 M Cupric Chloride solution to the vial.
   6. Add 0.500 mL of the 1.0 M Thiourea solution to the vial.
C. Preparation of the Substrate.
   1. Coated-CNT substrates are immersed into enough d.i. $H_2O$ to completely cover their surfaces at a rate that is slow enough to gently displace any trapped air with water.
   2. The substrates are left soaking in water for a minimum of 10 min or until they are needed for Step D1.
   3. Upon removing the substrates from the water, excess water is allowed to drip from the surface; however, they are not allowed to dry, but are instead dipped into the CBD solution wet (Step D1).
D. Coating of the Substrate.
   1. Immediately after completing Step C3, immerse substrate into the resultant CBD solution within the vial. Note: Substrate was oriented vertically or with the side of interest tilted face down to minimize the unwanted deposition of bulk precipitate due to gravity.
   2. Place vial in a heating bath @ 80° C. for 2 h.
   3. After 2 h. have passed, remove the substrate from the CBD solution and rinse it with copious amounts (~50 mL) of d.i. $H_2O$ to remove any reagents and adsorbed precipitate.
   4. Samples are allowed to dry in air at room temperature before characterization.
III. Exemplary Procedure for Preparation of Chemical Bath Deposition (CBD) Solution for Deposition of Un-Doped Cadmium Sulfide (CdS) onto CdSe-Coated Carbon Nanotube (CNT) Substrates and Ex Situ Cu Doping.
A. Preparation of Stock Solutions (10 mL Total Volumes).
   1. 1.0 M Cadmium Sulfate solution: dissolve 2.09 g of Cadmium Sulfate ($CdSO_4$) with de-ionized water (d.i. $H_2O$) to a final volume of 10 mL.
   2. 15 M Ammonia solution: use concentrated Ammonium Hydroxide ($NH_4OH$) solution (conc=15 M $NH_3$) as purchased.
   3. 1.0 M Thiourea solution: dissolve 0.761 g of Thiourea ($CH_4N_2S$, TU) with de-ionized water (d.i. $H_2O$) to a final volume of 10 mL.
   4. 3.75 M Triethanolamine solution: dissolve 5.59 g Triethanolamine ($C_6H_{15}NO_3$, TEA) with d.i. $H_2O$ to a final volume of 10 mL.
   5. 0.1 M Cupric Chloride solution: dissolve 0.170 g of Cupric Chloride Dihydrate ($CuCl_2.2H_2O$) with de-ionized water (d.i. $H_2O$) to a final volume of 10 mL.
   6. 0.005 M Cupric Chloride solution: dilute 0.5 mL of 0.1 M Cupric Chloride solution with de-ionized water (d.i. $H_2O$) to a final volume of 10 mL.
B. Preparation of CBD Solution (10 mL Total Volume).
   1. Place 8.03 mL of d.i. $H_2O$ in a vial.
   2. Add 0.500 mL of the 1.0 M Cadmium Sulfate solution to the vial.
   3. Add 0.467 mL of the 3.75 M Triethanolamine solution to the vial.
   4. Add 0.500 mL of the 15 M Ammonia solution to the vial.
   5. Add 0.500 mL of the 1.0 M Thiourea solution to the vial.
C. Preparation of the Substrate.
   1. Coated-CNT substrates are immersed into enough d.i. $H_2O$ to completely cover their surfaces at a rate that is slow enough to gently displace any trapped air with water.
   2. The substrates are left soaking in water for a minimum of 10 min or until they are needed for Step D1.
   3. Upon removing the substrates from the water, excess water is allowed to drip from the surface; however, they are not allowed to dry, but are instead dipped into the CBD solution wet (Step D1).
D. Coating of the Substrate.
   1. Immediately after completing Step C3, substrates are immersed into the resultant CBD solution within the vial. Note: Substrates are oriented vertically or with the side of interest tilted face down to minimize the unwanted deposition of bulk precipitate due to gravity.
   2. Place vial in a heating bath @ 80° C. for 2 h.
   3. After 2 h. have passed, remove the substrate from the CBD solution and rinse it with copious amounts (~50 mL) of d.i. $H_2O$ to remove any reagents and adsorbed precipitate.
   4. Samples are allowed to dry in air at room temperature before characterization.
E. Ex Situ Doping of the Coating.
   1. Immerse CdS-coated substrate from Step D4 into the 0.005 M Cupric Chloride solution for 30 s. The film color will change from bright orange to dark brown as Cu doping occurs.
   2. After 30 s have passed, remove sample from solution and rinse it with copious amounts (~50 mL) of d.i. $H_2O$ to remove any reagents.
IV. Exemplary Procedure for Preparation of Chemical Bath Deposition (CBD) Solution for Deposition of In Situ Cu-Doped Zinc Sulfide (ZnS) onto CdSe-Coated Carbon Nanotube (CNT) Substrates.
A. Preparation of Stock Solutions (10 mL Total Volumes).
   1. 1.0 M Zinc Sulfate solution: dissolve 2.88 g of Zinc Sulfate Heptahydrate ($ZnSO_4.7H_2O$) with de-ionized water (d.i. $H_2O$) to a final volume of 10 mL.
   2. 0.8 M Sodium Citrate solution: dissolve 2.32 g of Sodium Citrate Dihydrate ($Na_3C_6H_5O_7.2H_2O$) with d.i. $H_2O$ to a final volume of 10 mL.
   3. 15 M Ammonia solution: concentrated Ammonium Hydroxide ($NH_4OH$) solution (conc=15 M $NH_3$) as purchased.
   4. 3.75 M Triethanolamine solution: dissolve 5.59 g Triethanolamine ($C_6H_{15}NO_3$, TEA) with d.i. $H_2O$ to a final volume of 10 mL.
   5. 0.1 M Cupric Chloride solution: dissolve 0.170 g of Cupric Chloride Dihydrate ($CuCl_2.2H_2O$) with de-ionized water (d.i. $H_2O$) to a final volume of 10 mL.
   6. 1.0 M Thiourea solution: dissolve 0.761 g of Thiourea ($CH_4N_2S$, TU) with de-ionized water (d.i. $H_2O$) to a final volume of 10 mL.
B. Preparation of CBD Solution (10 mL Total Volume, Final pH=10.0-10.1).
   1. Place 7.16 mL of d.i. $H_2O$ in a vial.
   2. Add 0.150 mL of the 1.0 M Zinc Sulfate solution to the vial.
   3. Add 0.560 mL of the 0.8 M Sodium Citrate solution to the vial.
   4. Add 0.200 mL of the 15 M Ammonia solution to the vial.
   5. Add 0.400 mL of the 3.75 M Triethanolamine solution to the vial.
   6. Add 0.036 mL of the 0.1 M Cupric Chloride solution to the vial.
   7. Add 1.50 mL of the 1.0 M Thiourea solution to the vial.

C. Preparation of the Substrate.
1. Coated-CNT substrates are immersed into enough d.i. $H_2O$ to completely cover their surfaces at a rate that is slow enough to gently displace any trapped air with water.
2. The substrates are left soaking in water for a minimum of 10 min or until they are needed for Step D1.
3. Upon removing the substrates from the water, excess water is allowed to drip from the surface; however, they are not allowed to dry, but are instead dipped into the CBD solution wet (Step D1).

D. Coating of the Substrate.
1. Immediately after completing Step C3, immerse substrate into the resultant CBD solution within the vial. Note: Substrates are oriented vertically or with the side of interest tilted face down to minimize the unwanted deposition of bulk precipitate due to gravity.
2. Place vial in a heating bath @ 80° C. for 4 h.
3. After 4 h. have passed, remove the substrate from the CBD solution and rinse it with copious amounts (~50 mL) of d.i. $H_2O$ to remove any reagents and adsorbed precipitate.
4. Samples are allowed to dry in air at room temperature before characterization.

V. Exemplary Procedure for Preparation of Chemical Bath Deposition (CBD) Solution for Deposition of Un-Doped Zinc Sulfide (ZnS) onto CdSe-Coated Carbon Nanotube (CNT) Substrates and Ex Situ Cu Doping.

A. Preparation of Stock Solutions (10 mL Total Volumes).
1. 1.0 M Zinc Sulfate solution: dissolve 2.88 g of Zinc Sulfate Heptahydrate ($ZnSO_4.7H_2O$) with de-ionized water (d.i. $H_2O$) to a final volume of 10 mL.
2. 0.8 M Sodium Citrate solution: dissolve 2.32 g of Sodium Citrate Dihydrate ($Na_3C_6H_5O_7.2H_2O$) with d.i. $H_2O$ to a final volume of 10 mL.
3. 15 M Ammonia solution: use concentrated Ammonium Hydroxide ($NH_4OH$) solution (conc=15 M $NH_3$) as purchased.
4. 3.75 M Triethanolamine solution: dissolve 5.59 g Triethanolamine ($C_6H_{15}NO_3$, TEA) with d.i. H2O to a final volume of 10 mL.
5. 0.1 M Cupric Chloride solution: dissolve 0.170 g of Cupric Chloride Dihydrate ($CuCl_2.2H_2O$) with de-ionized water (d.i. $H_2O$) to a final volume of 10 mL.
6. 0.005 M Cupric Chloride solution: dilute 0.5 mL of 0.1 M Cupric Chloride solution with de-ionized water (d.i. $H_2O$) to a final volume of 10 mL.
7. 1.0 M Thiourea solution: dissolve 0.761 g of Thiourea ($CH_4N_2S$, TU) with de-ionized water (d.i. $H_2O$) to a final volume of 10 mL.

B. Preparation of CBD Solution (10 mL Total Volume, Final pH=10.0-10.1).
1. Place 7.20 mL of d.i. $H_2O$ in a vial.
2. Add 0.150 mL of the 1.0 M Zinc Sulfate solution to the vial.
3. Add 0.560 mL of the 0.8 M Sodium Citrate solution to the vial.
. Add 0.200 mL of the 15 M Ammonia solution to the vial.
5. Add 0.400 mL of the 3.75 M Triethanolamine solution to the vial.
6. Add 1.50 mL of the 1.0 M Thiourea solution to the vial.

C. Preparation of the Substrate.
1. Coated-CNT substrates are immersed into enough d.i. $H_2O$ to completely cover their surfaces at a rate that is slow enough to gently displace any trapped air with water.
2. The substrates are left soaking in water for a minimum of 10 min or until they are needed for Step D1.
3. Upon removing the substrates from the water, excess water is allowed to drip from the surface; however, they are not allowed to dry, but are instead dipped into the CBD solution wet (Step D1).

D. Coating of the Substrate.
1. Immediately after completing Step C3, immerse substrate into the resultant CBD solution within the vial. Note: Substrate should be oriented vertically or with the side of interest tilted face down to minimize the unwanted deposition of bulk precipitate due to gravity.
2. Place vial in a heating bath @ 80° C. for 4 h.
3. After 4 h. have passed, remove the substrate from the CBD solution and rinse it with copious amounts (~50 mL) of d.i. $H_2O$ to remove any reagents and adsorbed precipitate.
4. Samples are allowed to dry in air at room temperature before characterization.

E. Ex Situ Doping of the Coating.
1. Immerse CdS-coated substrate from Step D4 into the 0.005 M Cupric Chloride solution for 30 s. The film color will change from bright orange to dark brown as Cu doping occurs.
2. After 30 s have passed, remove sample from solution and rinse it with copious amounts (~50 mL) of d.i. $H_2O$ to remove any reagents.

VI. Reagent Specifications

Cadmium Sulfate ($CdSO_4$)

FW: 208.46 g/mol
Purity: 99%
Grade: ACS Reagent
Vendor: Sigma Aldrich
Product No.: 383082-100G
Sodium Citrate Dihydrate ($Na_3C_6H_5O_7 \cdot 2H_2O$)

FW: 294.10 g/mol
Purity: Meets USP Spec
Vendor: Sigma Aldrich
Product No.: S1804-1KG
Sodium Sulfite ($Na_2SO_3$)

FW: 126.04 g/mol
Grade: Certified ACS
Vendor: Fisher Scientific
Product No.: S430-500
1,1-Dimethyl-2-Selenourea ($C_3H_8N_2Se$, DMSU), Note: Stored in Argon glove box.

FW: 151.07 g/mol
Purity: 97%
Vendor: Sigma Aldrich
Product No.: 278882-1G
Ammonium Hydroxide ($NH_4OH$) solution, concentrated FW: 35.05 g/mol
Grade: Certified ACS
Vendor: Fisher Scientific
Product No.: A669-212
Ammonium Chloride ($NH_4Cl$)

FW: 53.49 g/mol
Grade: Certified ACS
Vendor: Fisher Scientific
Product No.: A661-500
Thiourea ($CH_4N_2S$, TU)

FW: 76.12 g/mol
Purity: 99.0%
Grade: ACS Reagent

-continued

Vendor: Sigma Aldrich
Product No.: T8656-500G
Cupric Chloride Dihydrate ($CuCl_2 \cdot 2H_2O$)

FW: 170.48 g/mol
Purity: 99.0%
Grade: ACS Reagent
Vendor: Sigma Aldrich
Product No.: 307483-100G
Zinc Sulfate Heptahydrate ($ZnSO_4 \cdot 7H_2O$)

FW: 287.56 g/mol
Purity: 99.0%
Grade: ACS Reagent
Vendor: Sigma Aldrich
Product No.: 221376-500G
Triethanolamine ($C_6H_{15}NO_3$, TEA)

FW: 149.19 g/mol
Purity: 98%
Vendor: Sigma Aldrich
Product No.: T1377-1L
Mercury (II) Chloride ($HgCl_2$)

Figure 11:
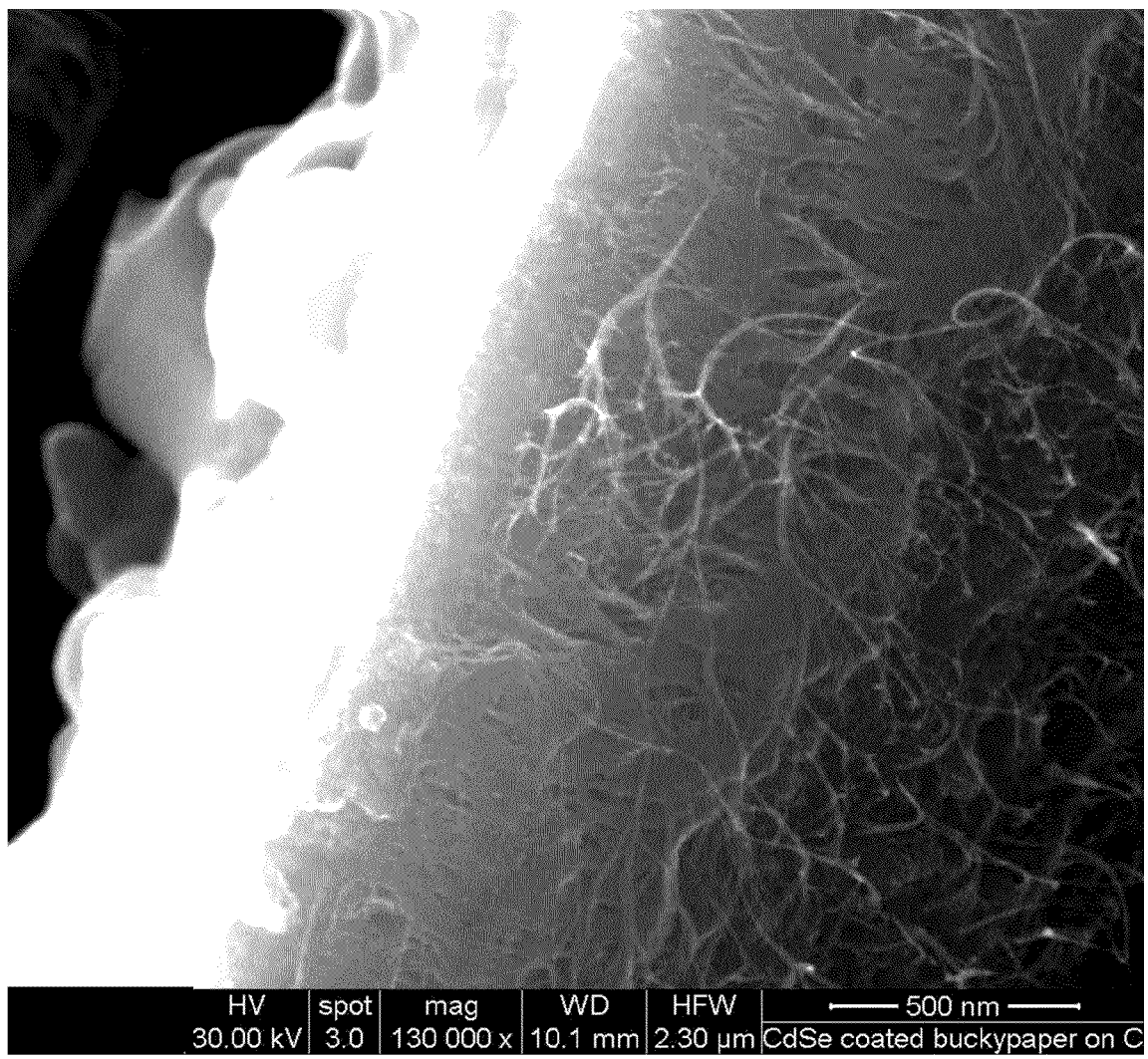
FIG. 11 is a scanning electron microscope image of a mesh of carbon nanotubes (on buckypaper) coated with CdSe which was fabricated using a chemical bath deposition process.

FW: 271.50 g/mol
Purity: 99.5%
Grade: ACS Reagent
Vendor: Sigma Aldrich
Product No.: 215465-100G By way of illustration, FIG. 11 shows an exemplary scanning electron microscope image of a mesh of carbon nanotubes (on buckypaper) coated with CdSe. The CdSe coating was created using the CBD procedure described above for coating CNT substrates with CdSe (Procedure I). As can be seen from the image, the CdSe has been built up to cover the mesh of carbon nanotubes.

Figure 12:
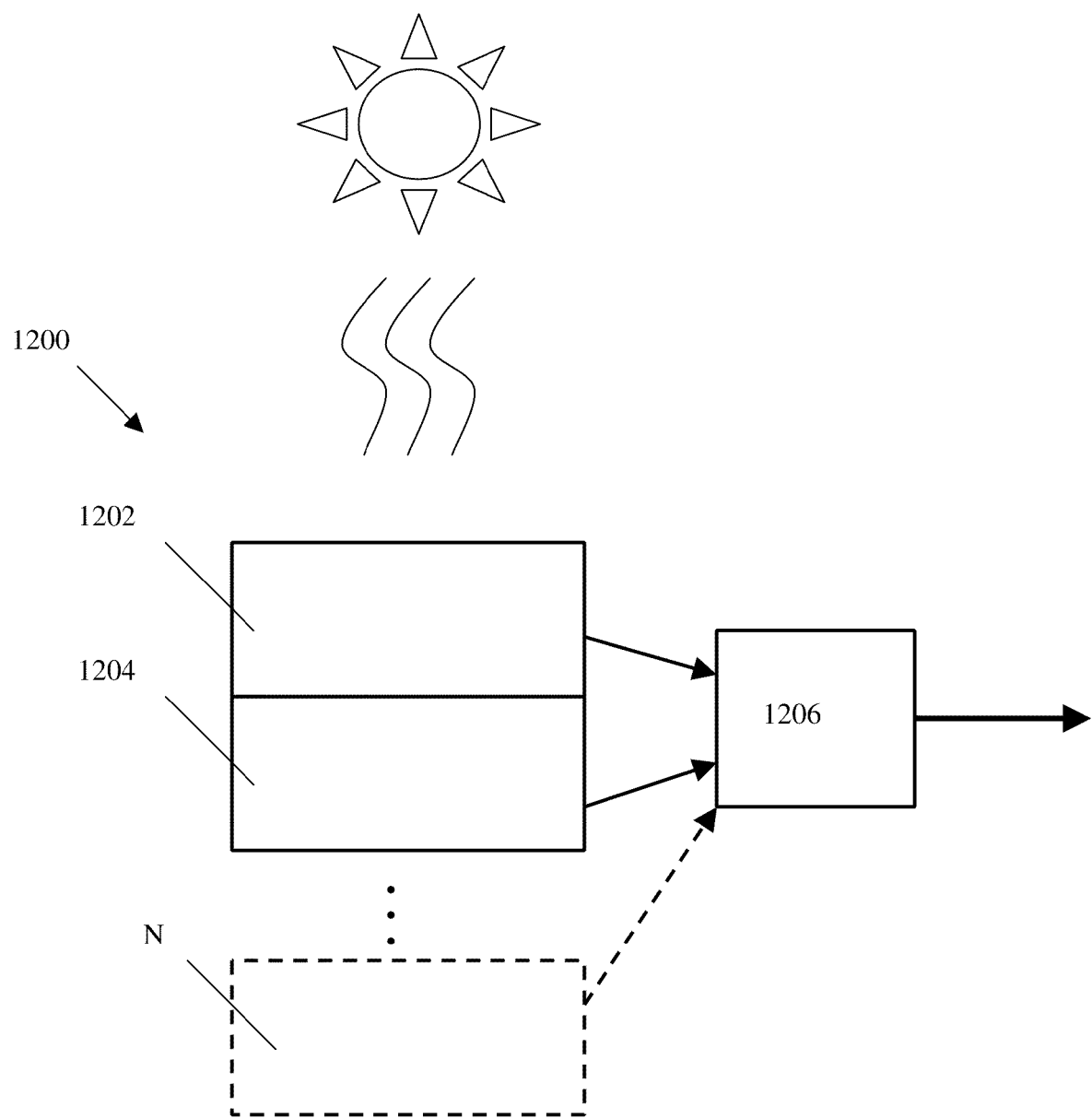
FIG. 12 is a schematic view of a tandem solar cell that incorporates the photovoltaic devices described herein.

The photovoltaic devices and methods described herein can be incorporated into films, modules, arrays, and other products. FIG. 12 is a schematic view of an exemplary tandem solar cell (also known as a multi-junction cell) which includes a plurality of photovoltaic cells. In this embodiment, a first cell 1202 is stacked on a second cell 1204 such that some portion of solar radiation is absorbed by the first cell 1202, and radiation that is not absorbed passes through the first cell 1202 and can be absorbed by the second cell 1204. More specifically, the first and second cells 1202, 1204 can be designed (e.g., by selecting materials having suitable band gaps, by selecting the thickness of the absorbing layers) to absorb photons different wavelengths. Such cascading of cells, of which there can be several, can advantageously enhance the overall absorption of the tandem cell 1200. In many embodiments, the first cell 1202 can capture high-energy photons while passing lower-energy photons to be absorbed by subsequent cells. The output of the cells 1202, 1204 can be combined, e.g., at junction box 1206. In other embodiments, the tandem solar cells can be monolithically integrated, as is known in the art.

Any of the cells 1202, 1204 can be constructed in accordance with the teachings of this disclosure, e.g., they can represent any of the photovoltaic devices previously described. Further, a cell that does not utilize the teachings of this application (e.g., a solar cell constructed previously known, or later developed) can be combined with one that does, e.g., as a new or a retrofitted product.

Figure 13A:
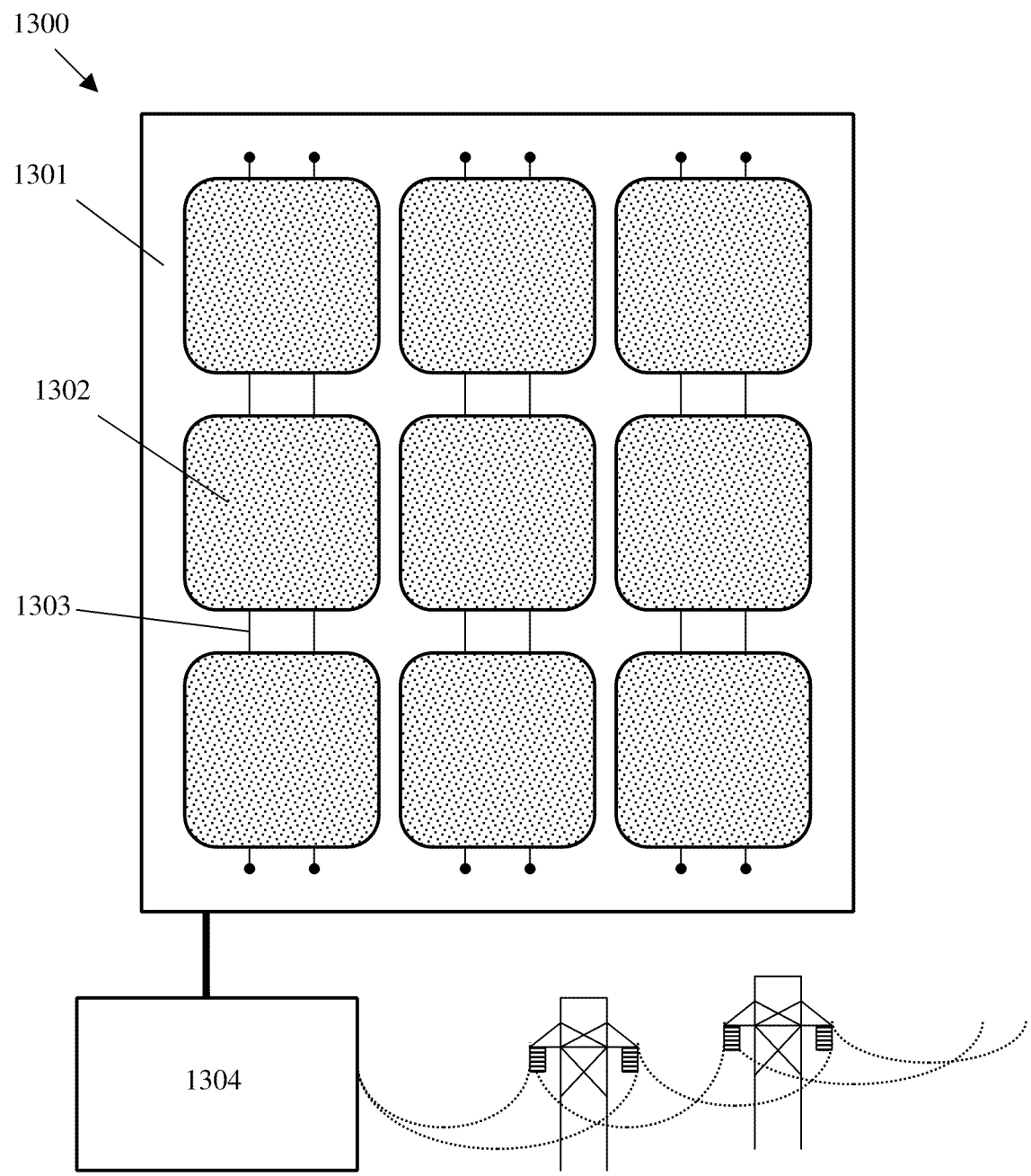
FIG. 13A is a schematic view of an exemplary solar cell module that incorporates the photovoltaic devices described herein.

FIG. 13A is a schematic view of an exemplary solar cell module 1300 that incorporates the photovoltaic cells described herein. In this example, a module substrate 1301, which can be rigid or flexible, supports an array of several photovoltaic cells 1302 (e.g., which can be photovoltaic devices 100, or others). The photovoltaic cells 1302 can be electrically coupled (e.g., in series, parallel, etc.) in virtually any arrangement to achieve desired voltage and current characteristics for the module 1300, although in other embodiments the cells 1302 can be electrically isolated. (In FIG. 13A, the cells 1302 are coupled into groups of three by lines 1303, although this is merely illustrative.) The module 1300 be electrically coupled to a transformer 1304, which can convert the electrical output of the module (produced by the cells 1302) as desired for transmission, use, or otherwise.

Figure 13B:
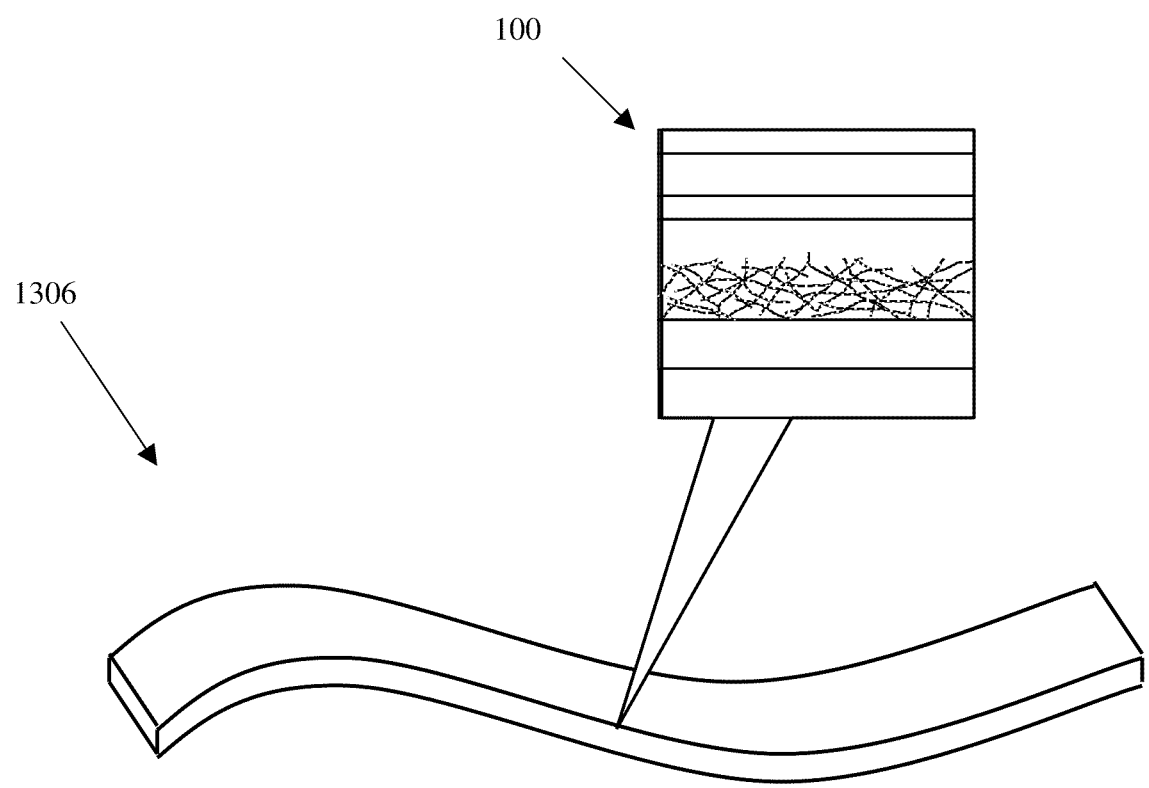
FIG. 13B is a schematic view of an exemplary flexible solar cell film that incorporates the photovoltaic devices described herein.

FIG. 13B is a schematic view of an exemplary flexible film 1306 that incorporates the photovoltaic devices and principles described herein. In this example, the flexible film 1306 is made of a substantially planar sheet in which photovoltaic cells (here, photovoltaic device 100) are incorporated. In many embodiments, the photovoltaic cells can be disposed between two flexible substrates, at least one of which is transparent to solar radiation. A plurality of separate electrically connected cells, each one constructed, e.g., in the manner of photovoltaic cell 100, can be disposed on the film (e.g., on a flexible substrate) and can be electrically connected to one another. In other embodiments, the film 1306 can represent a single cell, e.g., the photovoltaic device 100.

Figure 14:
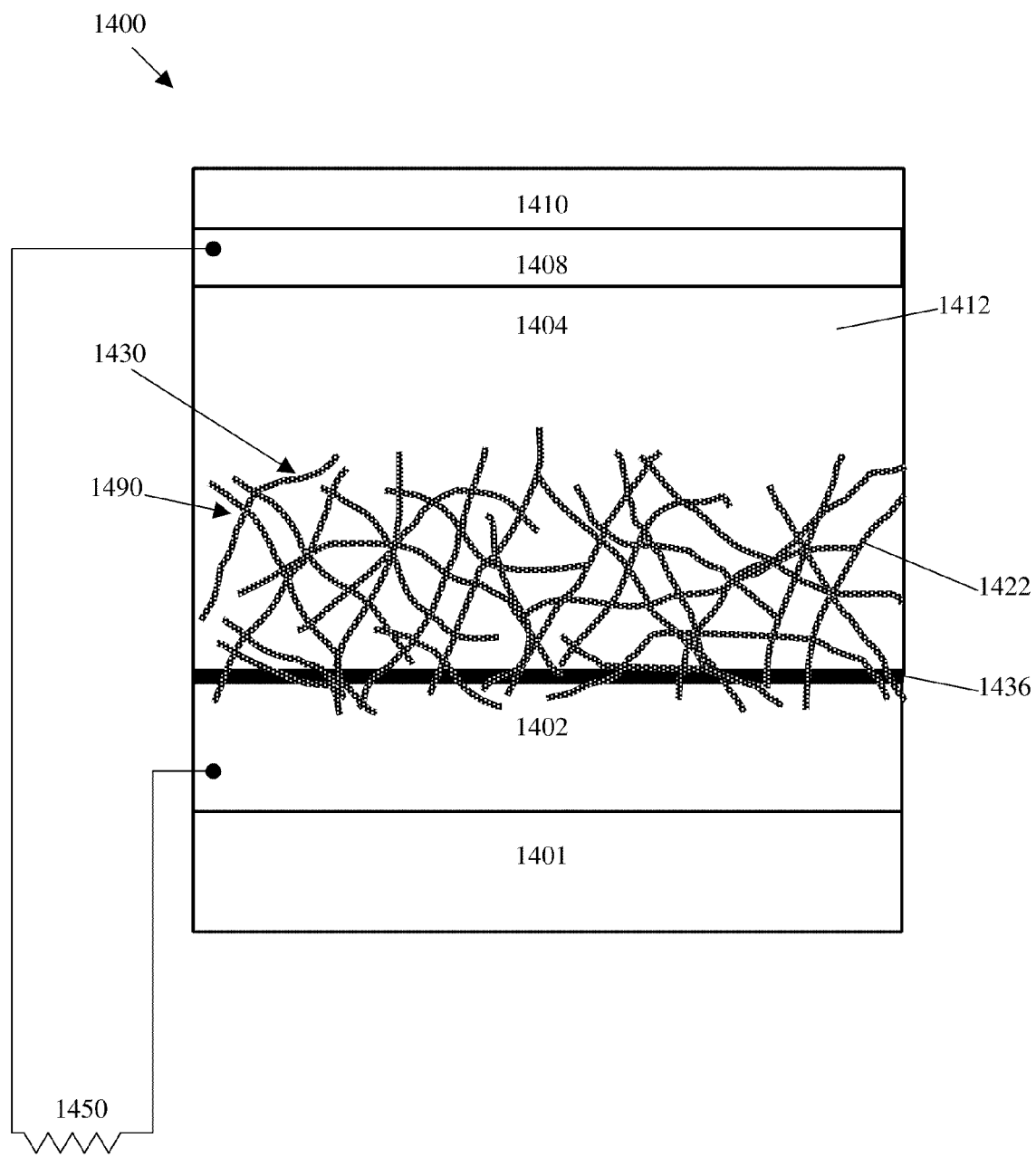
FIG. 14 is a schematic view of an exemplary photovoltaic device which includes an absorption layer with a mesh of semiconducting carbon nanotubes embedded therein, the interface of the absorption layer and semiconducting carbon nanotubes forming a junction.

In yet other aspects, devices are disclosed that employ semiconducting carbon nanostructures. By way of example, FIG. 14 illustrates a photovoltaic device 1400 having a light-responsive absorption layer 1404 that contains carbon nanotubes 1422 disposed within a semiconductor material 1412. In photovoltaic device 1400, the window layer (as described in previous embodiments, for example) has been omitted, although in other embodiments a window layer can be included. In this case, the carbon nanotubes 1422 form a mesh.

In this embodiment, the carbon nanotubes 1422 are configured to exhibit semiconductor characteristics. For example, their electronic structure can be characterized by a valence band and a conduction band separated in energy by a band gap. Semiconducting carbon nanotubes are known, as are methods for producing them.

For example, single wall carbon nanotubes have been measured or predicted to have band gaps in a range of about 0.16 eV to about 1.6 eV. Without being limited by theory, the band gap has been shown to depend on the diameter and chirality of the tube. The band gap can be controlled by adjusting these factors. For example, the band gap can be controlled by adjusting the diameter of the single-wall carbon nanotubes. In some cases single-wall carbon nanotubes can be fabricated to have a diameter anywhere in a range of about 0.5 nanometers (nm) to about 5.0 nm.

Carbon nanotubes can be doped, for example, by adsorption, which involves depositing a dopant on the surface of the carbon nanotubes such that there is a charge transfer from the adsorbed molecules or atoms. N-type dopants include, e.g., potassium, ammonia, polyethyleneimine, hydrazine. Exposure of carbon nanotubes to oxygen (e.g. in air) has been shown to cause them to become p-type. Further, thermal annealing of tubes can produce n-type carbon nanotubes. (See, e.g., Michael J. O'Connell, Carbon Nanotubes: Properties And Applications 103-104 (CRC Press 2006), which is hereby incorporated by reference.)

Carbon nanotubes can also be doped to be p-type or n-type using other techniques. Carbon nanotubes can be doped to be p-type by injecting a halogen, such as bromine or iodine, into a carbon nanotube, e.g., into the interior thereof. In some cases, the halogen element can be delivered via a fullerene. N-type doping is also possible by injecting an alkali element such as sodium or potassium into the carbon nanotube. In either case, the injection can be accomplished by infusing the carbon nanotube with a donor gas under suitable atmospheric conditions, for example, in a chamber heated to about 300 to 600 degrees Celsius. More information about doping carbon nanotubes using such techniques can be found in U.S. Patent Publication No. 2006/0067870 (Park et al., "P-Type Semiconductor Carbon Nanotube and Method of Manufacturing the Same," and U.S. Pat. No. 6,723,624 (Wang et al., "Method For Fabricating N-Type Carbon Nanotube Device"), both of which are hereby incorporated by reference in their entireties.

Further, carbon nanotubes can be doped by exposure to a one-electron oxidant in solution under suitable conditions, e.g., where the concentration of the oxidant is about 0.01 mM to about 20 mM and at a temperature from about 10 degrees Celsius to about 100 degrees Celsius. Examples of one-electron oxidants include organic one electron oxidants (e.g., trialkyloxonium hexachlroantimonate, antimony pentachloride, nitrosonium salts, tris-(pentafluorophenyl)borane and nitrosonium cation), metal organic complexes (e.g., tris-(2, 2'-bipyridyl)cobalt (III) and tris-(2,2'-bipyridyl)ruthenium (II)), pi-electron acceptors (e.g., tetracyanoquinodimethane, benzoquinone, tetrachlorobenzoquinone, tetrafluorobenzoquinone, tetracynaoethylene, tetrafluoro-tertracyanoquinodimethane, chloranil, bromanil and dichlorodicyanobenzoquinone), and silver salts. More information about doping carbon nanotubes using such techniques can be found in U.S. Pat. No. 7,253,431 (Afzali-Ardakani et al., "Method and Apparatus for Solution Processed Doping of Carbon Nanotube"), which is hereby incorporated by reference in its entirety.

It should be understood that in other embodiments, carbon nanostructures other than carbon nanotubes, such as graphene structures, can be used. Graphene can be doped using a variety of known techniques. For example, graphene sheets can be substitutionally doped with boron by exposing each side of a sheet to different elements, e.g., boron and nitrogen, and exposing the result to a hydrogen rich environment, as described in Pontes et al., "Barrier-free substitutional doping of graphene sheets with boron atoms: Ab initio calculations," Phys. Rev. B 79, 033412 (2009), which is hereby incorporated by reference. N-doped graphene can be fabricated using a chemical vapor deposition method which produces graphene sheets substitutionally doped with nitrogen, as described in Wei et al., "Synthesis of N-Doped Graphene by Chemical Vapor Deposition and Its Electrical Properties," Nano Lett., 9 (5), pp. 1752-1758 (2009), which is hereby incorporated by reference. Such doped carbon nanostructures exhibiting semiconductor characteristics can be used, for example, instead of or in addition to the carbon nanotubes.

Returning to FIG. 14, each interface between a semiconducting carbon nanotube 1422 and the semiconductor material 1412 surrounding it can form a junction 1430 supporting a charge depletion region. By way of illustration, the carbon nanotubes 1422 can be p-type single-wall carbon nanotubes, while the semiconductor material can be an n-type semiconductor (e.g., an intrinsically n-type semiconductor such as CdSe and/or a semiconductor doped to be n-type). In such an embodiment, the junction 1430 is a p-n junction, and can support a charge-depletion region.

The photovoltaic device 1400 can also include an insulating layer 1436, made of silicon dioxide for example, disposed between the semiconductor material 1412 and a back electrical contact 1402, which is disposed on a substrate 1401. The insulating layer 1436 can be porous, with the carbon nanotubes 1422 extending through the pores to reach the back electrical contact 1402. A top electrical contact 1408 can also be provided on the opposing side of the light-responsive layer 1404. Further, an antireflective coating 1410 can be disposed on the top of the top electrical contact 1408, such as the antireflective coating discussed with the embodiments presented above, e.g., the antireflective coating 110 shown in FIG. 1.

The photovoltaic device 1400 shown in FIG. 14 can include any of the features and materials described above in connection with FIGS. 1-13. For example, while the carbon nanotubes 1422 are illustrated as a mesh in FIG. 14, they can be aligned, upstanding, and so on. Similarly, while the semiconductor material 1412 has been described as CdSe, it can alternatively comprise any Group II-VI, III-V, IV, and I-III-VI semiconductor material. Further, the methods described above for fabricating photovoltaic cells (such as chemical bath deposition (CBD) methods and others) can be used to fabricate the photovoltaic device 1400 by omitting the deposition and/or creation of the window layer and by utilizing, for example, p-type single wall carbon nanotubes of a desired band gap or other semiconducting carbon nanostructures. Semiconducting carbon nanotubes can be fabricated as described above or obtained through purchase from suppliers such as Brewer Science of Rolla, Mo., USA, and Southwest Nanotechnologies of Norman, Okla., USA, among others.

In use, the photovoltaic device 1400 can be exposed to radiation that passes through the antireflective coating 1410 and top electrical contact 1408 (that is, in many embodiments, both the coating 1410 and the top electrical contact 1408 can be partially or wholly transparent to such radiation) to reach the semiconductor material 1412 of the light-responsive layer 1404. Some of the photons can be absorbed by the semiconductor material 1412 to create charge carriers (e.g., electron-hole pairs). As previously mentioned, and for explanatory purposes only, the semiconductor material 1412 can be made of an n-type semiconductor (e.g., CdSe), while the carbon nanotubes can be p-type single wall carbon nanotubes.

In such an embodiment, the electric field in the junction 1430 causes the separation of such electron-hole pairs in the vicinity thereof. Electrons can travel across the junction 1430 to the n-type semiconductor 1412 and holes can travel across the junction 1430 to the p-type carbon nanotubes 1422. Additionally, electron-hole pairs can be photo-generated outside the vicinity of the depletion region in the semiconductor material 1412 and can move (e.g., diffuse) through that material. Whether generated inside or outside the vicinity of the junction 1430, photogenerated electrons can migrate to the top electrical contact 1408, through the external load 1450, and through the back electrical contact 1402 to recombine with holes in the carbon nanotubes 1422. Such movement of charge-carriers represents a current which can generate a voltage across the load 1450 and, accordingly, represents electrical power.

While the carbon nanotubes 1422 have thus far been described as semiconducting carbon nanotubes, in some embodiments more than one kind of carbon nanotube can be utilized.

For example, some of the carbon nanotubes 1422 can be semiconducting single-wall carbon nanotubes while others, such as multi-wall carbon nanotubes, can be conductive. Such multi-wall carbon nanotubes can have a vanishing band gap and exhibit metallic conductive properties. The semiconducting carbon nanotubes can be interspersed with the multi-wall carbon nanotubes such that the interfaces of the two kinds of carbon nanotubes can form a junction. Arrow 1490 illustrates an exemplary location of a junction in such an embodiment, assuming the two interfacing carbon nanotubes 1422 depicted are of different type (that is, a semiconducting carbon nanotube and a carbon nanotube exhibiting a vanishing band gap, e.g., a multi-wall carbon nanotube). The junction between the semiconducting nanotubes and the multi-wall carbon nanotubes can result in the formation of a Schottky barrier. Thus the junction can support a charge depletion region to facilitate the charge separation of electron-hole pairs. It should be understood that in other embodiments such a Schottky barrier photovoltaic device can be created using only single-wall carbon nanotubes, some of which are semiconducting and others of which exhibit metallic conductive properties. For example, the process of fabricating single-wall carbon nanotubes can produce a batch of carbon nanotubes in which some proportion (e.g., about ⅔) of the tubes are semiconducting (e.g., p-type) while the remainder have metallic conductive properties. Such proportions of nanotubes can result, in some cases, from the carbon nanotube production process naturally, e.g., with little or no purification. In other cases, a batch of carbon nanotubes can be purified so as to have a desired proportion.

In yet other aspects, photodetectors are disclosed that employ nanostructured light-responsive layers. The photovoltaic device shown in FIG. 14 (and indeed any of the photovoltaic devices described herein) can be made into a photodetector suitable for detecting the presence and/or intensity of wavelengths of light. In some cases the wavelengths of light can be in the infrared region of the electromagnetic spectrum, e.g., at wavelengths in a range of about 700 nm to about 1 mm, or a portion of the infrared spectrum, e.g., about 0.7 microns to about 1.4 microns (IR-A), about 1.4 microns to about 3 microns (IR-B), and/or about 3 microns to about 1000 microns (IR-C).

Figure 15:
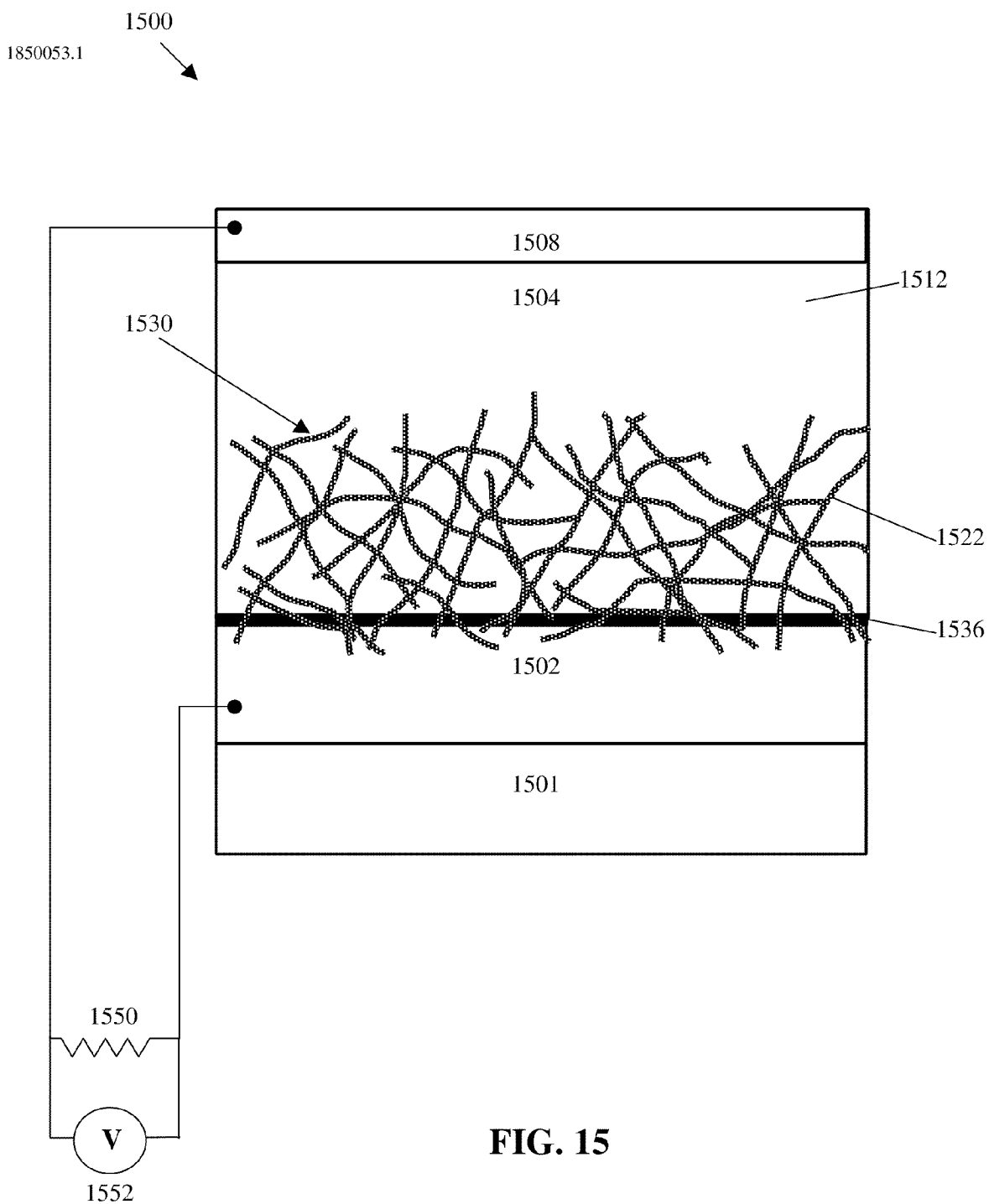
FIG. 15 is a schematic view of an exemplary photodetector device coupled to a voltage source for biasing thereof.

FIG. 15, for example, shows an exemplary embodiment of a photodetector 1500 with a light-responsive absorption layer 1504 that is made up of a mesh of semiconducting carbon nanotubes 1522 embedded in a semiconductor material 1512 to form a set of distributed p-n junctions 1530. An insulating layer 1536 electrically isolates the light-responsive layer 1504 from a back electrical contact 1502, which is disposed on a substrate 1501, but as shown some of the carbon nanotubes 1522 can extend through the insulating layer 1536 to connect with an electrical contact 1502 (e.g. to make ohmic contact therewith). In this embodiment, the photodetector 1500 also includes another electrical contact 1508 disposed on top of the light-responsive layer 1504. An external load 1550 can be electrically coupled to the photodetector 1500 via the electrical contacts 1502, 1508. Exposure of the light-responsive layer 1504 to radiation can cause a photocurrent to flow through the load 1550. Measurement and/or detection of this current (or a change in the current) can indicate the presence and/or intensity of radiation in the spectrum in which the photodetector 1500 is designed to operate. The magnitude of the current can correspond to the intensity of the radiation (e.g., a calibration procedure can be used to establish a relationship between the two). The band gaps of the semiconductor material 1512 and the semiconducting carbon nanotubes 1522 can dictate the wavelengths at which the photodetector 1500 will operate. For example, in some embodiments, the photodetector 1500 can exhibit a responsivity of about 0.1 A/W to about 0.6 A/W for wavelengths in a range of about 350 nm to about 2000 nm. The external load 1550 can be omitted in some cases and the response of the photodetector 1500 can be determined from the photovoltage (or a change in such voltage) across the electrical contacts 1502, 1508 that is produced by exposing the light-responsive layer 1504 to radiation of appropriate wavelength.

In some embodiments, a bias voltage (e.g., a reverse bias voltage) can be applied to the photodetector 1500 (e.g., via a voltage source 1552) as part of the photodetection process. Applying a reverse bias voltage can increase the sensitivity of the photodetector 1500 (and/or the linearity of its response) by shifting the conditions under which the photodetector 1500 is operating. In other words, applying a reverse bias voltage can force the photodetector 1500 to operate in a region of its I-V response curve which exhibits relatively linear behavior (e.g., an ohmic region) and which exhibits relatively large differences between quiescent (e.g., dark) and active (e.g., illuminated) states. More information about photodetectors, reverse biasing, and photodetection methods can be obtained with reference to U.S. Pat. No. 7,057,256 (Carey et al., "Silicon Based Visible and Near-Infrared Optoelectronic Devices"), which is hereby incorporated by reference in its entirety.

In many embodiments, photodetectors incorporating carbon nanostructures as described herein (e.g., metallic or semiconducting carbon nanotubes, or other nanostructures) can exhibit improved detection speed. Without being limited by theory, photodetectors incorporating carbon nanostructures as described herein can, in some embodiments, exhibit enhanced absorption of light for a given device thickness and accordingly allow for thinner devices. By reducing the thickness of a device (e.g., of the absorption layer), the average transmit time of a photo-generated charge carrier can be reduced relative to such time in a thicker device, allowing the carrier be collected (e.g., across the heterojunction and/or at an electrical contact) more quickly and increasing the speed of detection.

The teachings of U.S. Patent Application Publication No. 2006/0145194 (Barron et al., "Method For Creating a Functional Interface Between A Nanoparticle Nanotube or Nanowire, And A Biological Molecule Or System") are hereby incorporated by reference in their entirety. The teachings of U.S. patent Ser. No. 12/108,500, filed Apr. 23, 2008 and entitled "Nanostructured Solar Cells," (now published as U.S. Patent Publication No. 2008/0276987) are hereby incorporated by reference in their entirety.

One skilled in the art will appreciate further features and advantages based on the above-described embodiments. Accordingly, the claims are not to be limited by what has been particularly shown and described. All publications and references cited herein are expressly incorporated herein by reference in their entirety.

What is claimed is:

1. A photovoltaic device, comprising:
   a light-responsive layer including a plurality of semiconducting carbon nanostructures distributed within a semiconductor material such that at least some of said semiconducting carbon nanostructures form one or more junctions with the semiconductor material, the one or more junctions having a charge depletion region,
   said charge depletion region facilitating separation of electron-hole pairs generated in a vicinity thereof in response to radiation incident on said light-responsive layer,
   wherein the plurality of semiconducting carbon nanostructures provide an electrically conductive path out of the light-responsive layer to an electrical contact; and
   an electrically insulating layer disposed so as to insulate said semiconductor material from said electrical contact.

2. The photovoltaic device of claim 1, wherein said plurality of semiconducting carbon nanostructures comprise carbon nanotubes.

3. The photovoltaic device of claim 1, wherein said plurality of semiconducting carbon nanostructures comprise single-wall carbon nanotubes.

4. The photovoltaic device of claim 1, wherein said plurality of semiconducting carbon nanostructures comprise bundles of carbon nanotubes.

5. The photovoltaic device of claim 1, wherein the junction is a p-n junction.

6. The photovoltaic device of claim 1, wherein the semiconductor material comprises an n-type semiconductor material and the plurality of semiconducting carbon nanostructures comprises p-type carbon nanotubes.

7. The photovoltaic device of claim 1, wherein the light-responsive layer is spaced apart from the electrical contact by a gap with a plurality of the semiconducting carbon nanostructures extending across the gap to form an ohmic contact with the electrical contact.

8. The photovoltaic device of claim 1, wherein at least one of said plurality of semiconducting carbon nanostructures extends through said electrically insulating layer.

9. The photovoltaic device of claim 8, wherein said insulating layer includes a plurality of pores through which at least some of said plurality of semiconducting carbon nanostructures extend to said electrical contact to form an electrical coupling therewith.

10. The photovoltaic device of claim 1, wherein the electrical contact is a back electrical contact and the photovoltaic device further comprises a front electrical contact in electrical coupling with said semiconductor material.

11. The photovoltaic device of claim 1, wherein said plurality of semiconducting carbon nanostructures form a mesh.

12. The photovoltaic device of claim 11, wherein the mesh comprises intertwined carbon nanostructures defining interstices therebetween, wherein the interstices are sized such that electron-hole pairs generated in the interstices are located a distance apart from any carbon nanostructures that is less than about three diffusion lengths of photo-generated minority carriers in the semiconductor material of the light-responsive layer.

13. The photovoltaic device of claim 1, wherein at least some of said plurality of semiconducting carbon nanostructures exhibit a band gap in a range of about 0.16 eV to about 1.6 eV.

14. The photovoltaic device of claim 1, wherein at least some of said plurality of semiconducting carbon nanostructures comprise carbon nanotubes having a diameter in a range of about 0.5 nm to about 5 nm.

15. The photovoltaic device of claim 1, wherein the semiconductor material of the light-responsive layer is an inorganic semiconductor.

16. The photovoltaic device of claim 15, wherein the inorganic semiconductor material is CdS, CdO, CdSe, ZnS, CdTe, a Group II-VI semiconductor, a Group I-III-VI semiconductor, a Group IV semiconductor, or a Group III-V semiconductor.

17. A photovoltaic device, comprising:
a light-responsive layer including a semiconductor material,
a plurality of carbon nanostructures embedded in said semiconductor material so as to form a plurality of distributed p-n junctions therewith, and
an electrically insulating layer disposed so as to insulate said semiconductor material from said electrical contact.

18. The photovoltaic device of claim 17, wherein the carbon nanostructures comprise single-wall carbon nanotubes.

19. The photovoltaic device of claim 17, wherein said semiconductor material comprises an n-type semiconductor material and said carbon nanostructures comprise single-wall p-type carbon nanotubes.

20. The photovoltaic device of claim 17, wherein at least a portion of said semiconductor material is configured for exposure to an external source of radiation having one or more wavelengths suitable for generating electron-hole pairs in said semiconductor material.

21. The photovoltaic device of claim 20, wherein said p-n junctions facilitate separation of at least a portion of said photogenerated electron-hole pairs such that at least a portion of the separated holes migrate to said plurality of carbon nanostructures.

22. The photovoltaic device of claim 17, wherein at least one of said plurality of semiconducting carbon nanostructures extends through said electrically insulating layer.

23. The photovoltaic device of claim 17, wherein the semiconductor material of the light-responsive layer is an inorganic semiconductor.

24. The photovoltaic device of claim 23, wherein the inorganic semiconductor material is CdS, CdO, CdSe, ZnS, CdTe, a Group II-VI semiconductor, a Group I-III-VI semiconductor, a Group IV semiconductor, or a Group III-V semiconductor.

* * * * *